(12) United States Patent
Wan et al.

(10) Patent No.: US 10,872,842 B2
(45) Date of Patent: Dec. 22, 2020

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Albert Wan, Hsinchu (TW); Chen-Hua Yu, Hsinchu (TW); Chung-Shi Liu, Hsinchu (TW); Chao-Wen Shih, Hsinchu County (TW); Han-Ping Pu, Taichung (TW); Hsin-Yu Pan, Taipei (TW); Sen-Kuei Hsu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/283,852

(22) Filed: Feb. 25, 2019

(65) Prior Publication Data

US 2020/0273773 A1    Aug. 27, 2020

(51) Int. Cl.
| | |
|---|---|
| *H01L 23/66* | (2006.01) |
| *H01L 23/373* | (2006.01) |
| *H01L 23/538* | (2006.01) |
| *H01L 23/00* | (2006.01) |
| *H01L 21/48* | (2006.01) |
| *H01L 21/56* | (2006.01) |
| *H01Q 1/22* | (2006.01) |

(Continued)

(52) U.S. Cl.
CPC ...... *H01L 23/3737* (2013.01); *H01L 21/4853* (2013.01); *H01L 21/4857* (2013.01); *H01L 21/565* (2013.01); *H01L 21/568* (2013.01); *H01L 23/3128* (2013.01); *H01L 23/5383* (2013.01); *H01L 23/5386* (2013.01); *H01L 23/5389* (2013.01); *H01L 23/66* (2013.01); *H01L 24/19* (2013.01); *H01L 24/20* (2013.01); *H01Q 1/02* (2013.01); *H01Q 1/2283* (2013.01); *H01L 2223/6677* (2013.01); *H01L 2224/214* (2013.01)

(58) Field of Classification Search
CPC ............ H01L 23/3737; H01L 23/5386; H01L 23/3128; H01L 23/5383; H01L 23/66
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |

(Continued)

*Primary Examiner* — Trang Q Tran
(74) *Attorney, Agent, or Firm* — JCIPRNET

(57) ABSTRACT

A semiconductor device including a chip package and an antenna package disposed on the chip package is provided. The chip package includes a semiconductor chip, an encapsulation enclosing the semiconductor chip, and a redistribution structure disposed on the semiconductor chip and the encapsulation and electrically coupled to the semiconductor chip. The antenna package includes an antenna pattern electrically coupled to the chip package, and an intermediate structure disposed between the antenna pattern and the chip package, wherein the intermediate structure comprises a ceramic element in contact with the redistribution structure and thermally dissipating a heat generated from the semiconductor chip.

20 Claims, 28 Drawing Sheets

(51) Int. Cl.
*H01Q 1/02* (2006.01)
*H01L 23/31* (2006.01)

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2019/0173195 A1* | 6/2019 | Kim .................... H01Q 1/38 |

\* cited by examiner

SEMICONDUCTOR DEVICE AND MANUFACTURING METHOD THEREOF

BACKGROUND

Semiconductor devices and integrated circuits are used in a variety of electronic applications, such as personal computers, cell phones, digital cameras, and other electronic devices. As the demand for shrinking electronic devices has grown, a need for smaller and more creative packaging techniques of semiconductor devices has emerged. Thus, packages such as wafer-level packaging (WLP) have begun to be developed. For example, the dies of the wafer may be processed and packaged with other semiconductor devices (e.g. antenna) at the wafer-level. In addition, since the demand of modern communication for more bandwidth, high performance package designs with integrated antenna are desired.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
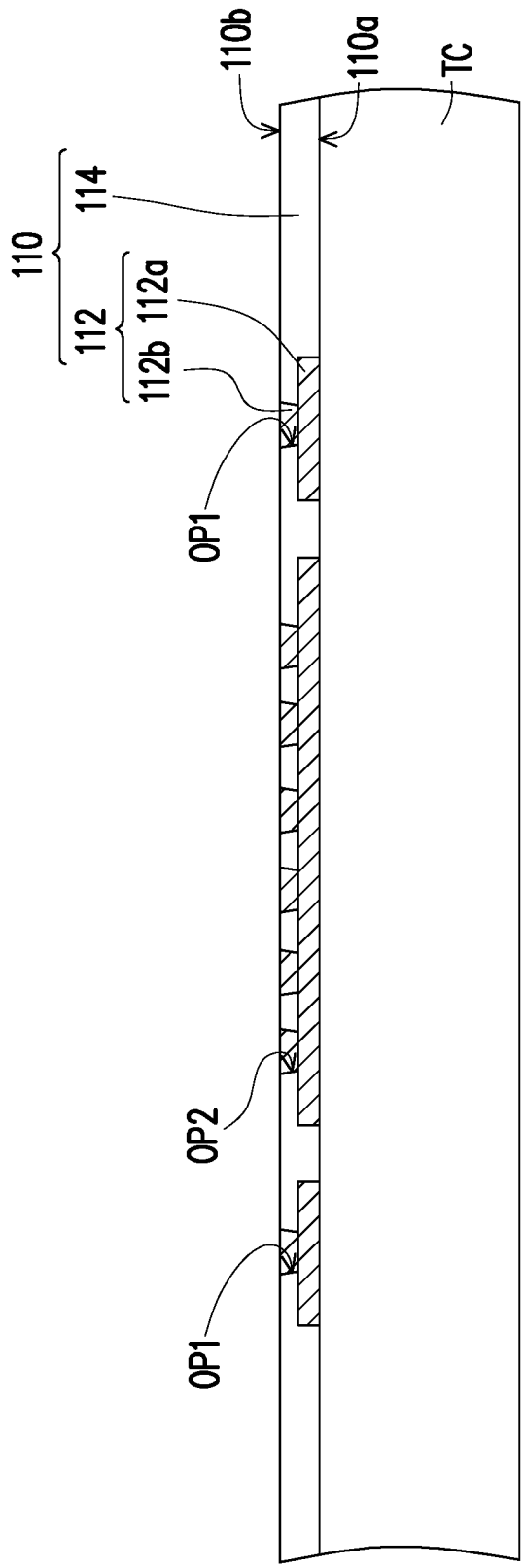
FIG. 1A to FIG. 1K are schematic cross-sectional views of various stages of manufacturing a semiconductor device in accordance with some exemplary embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
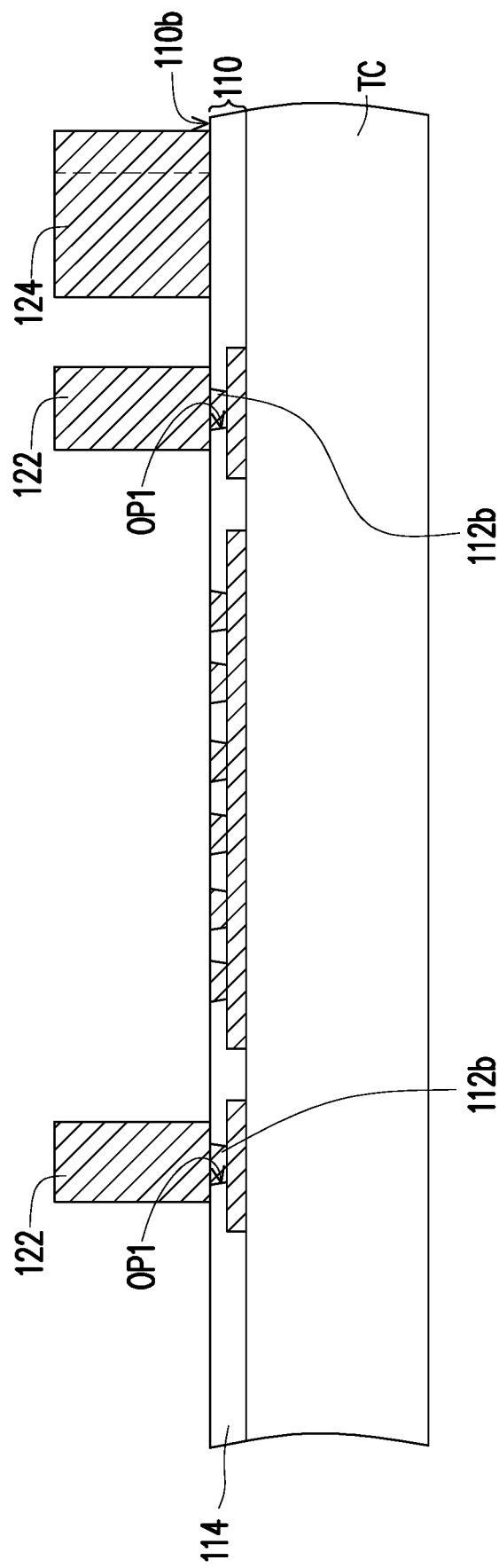
Figure 1C:
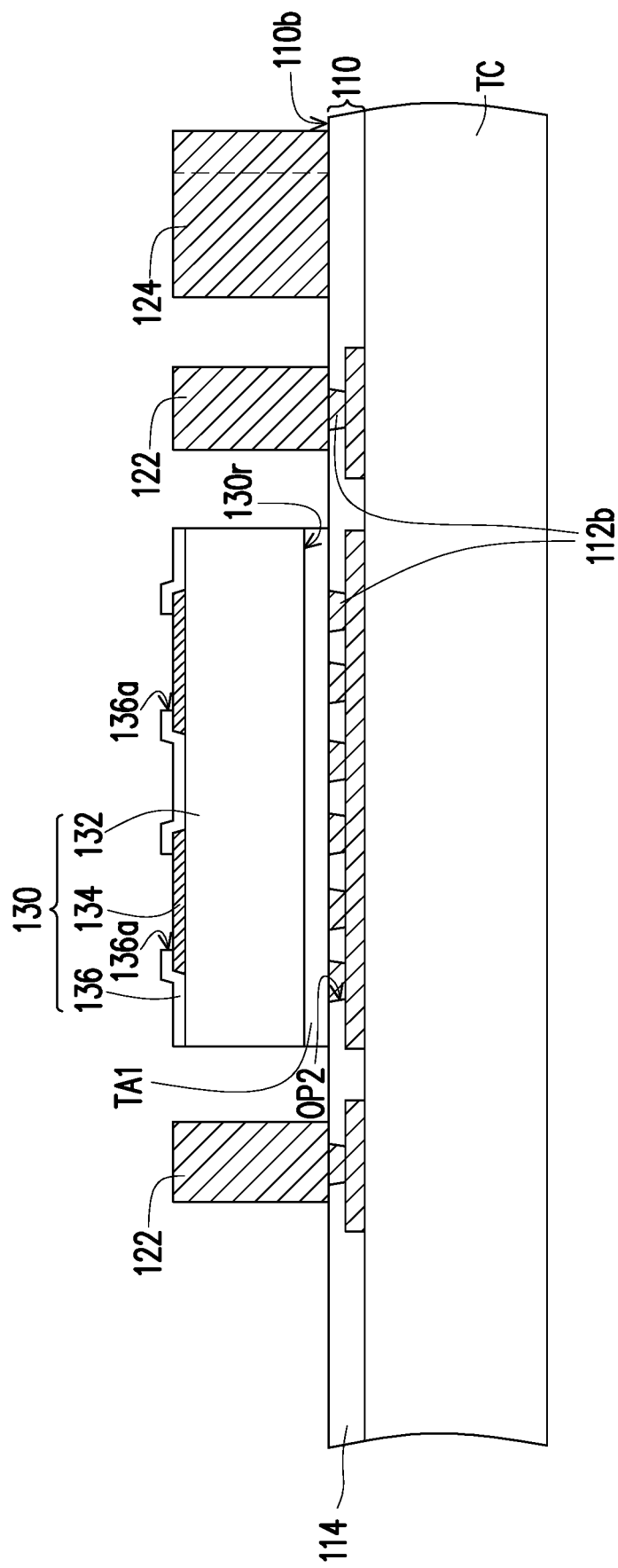
Figure 1D:
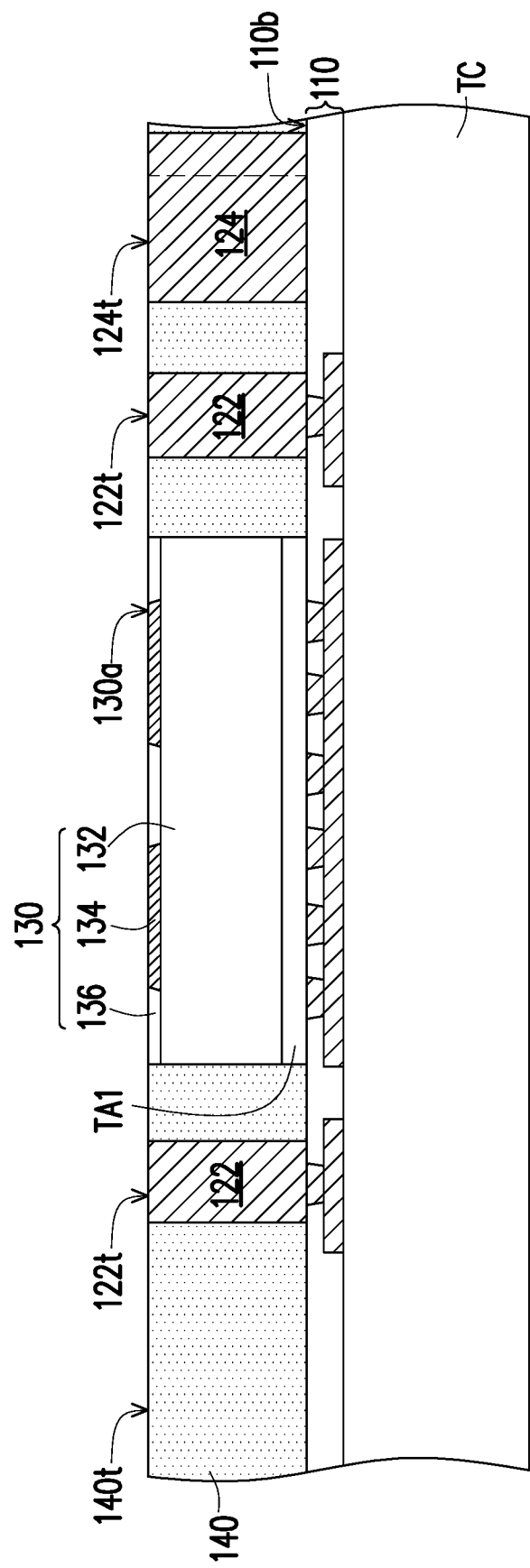
Figure 1E:
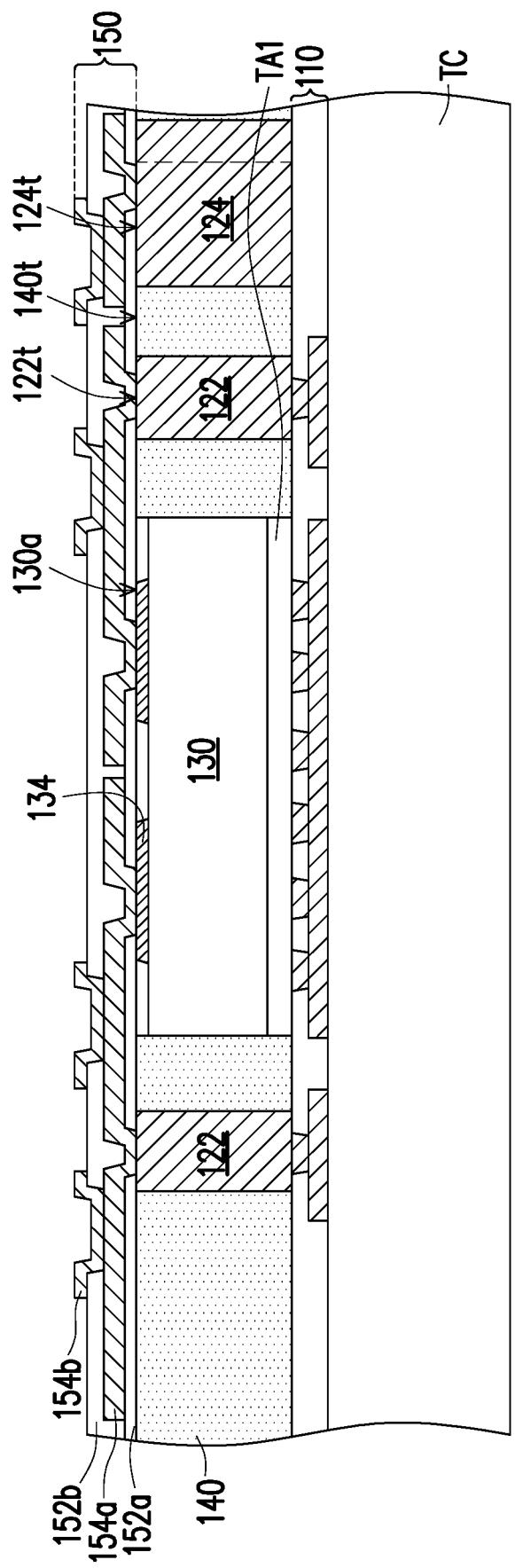
Figure 1F:
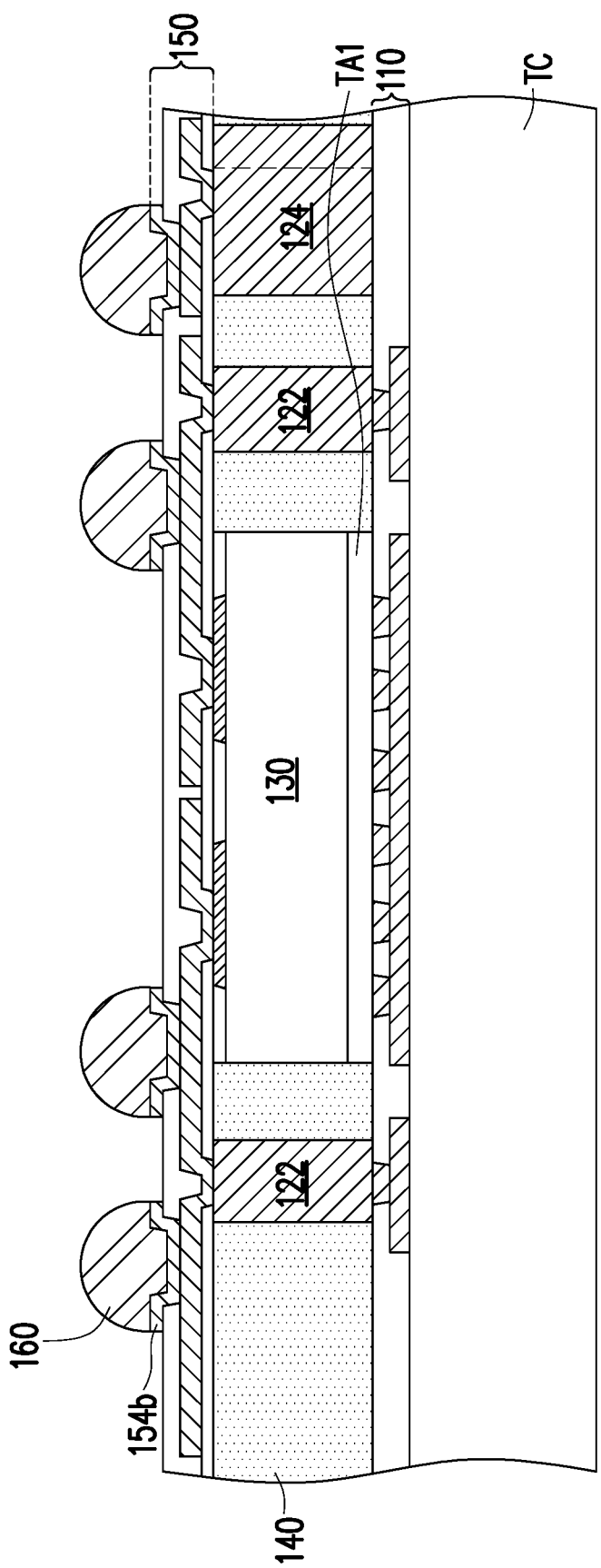
Figure 1G:
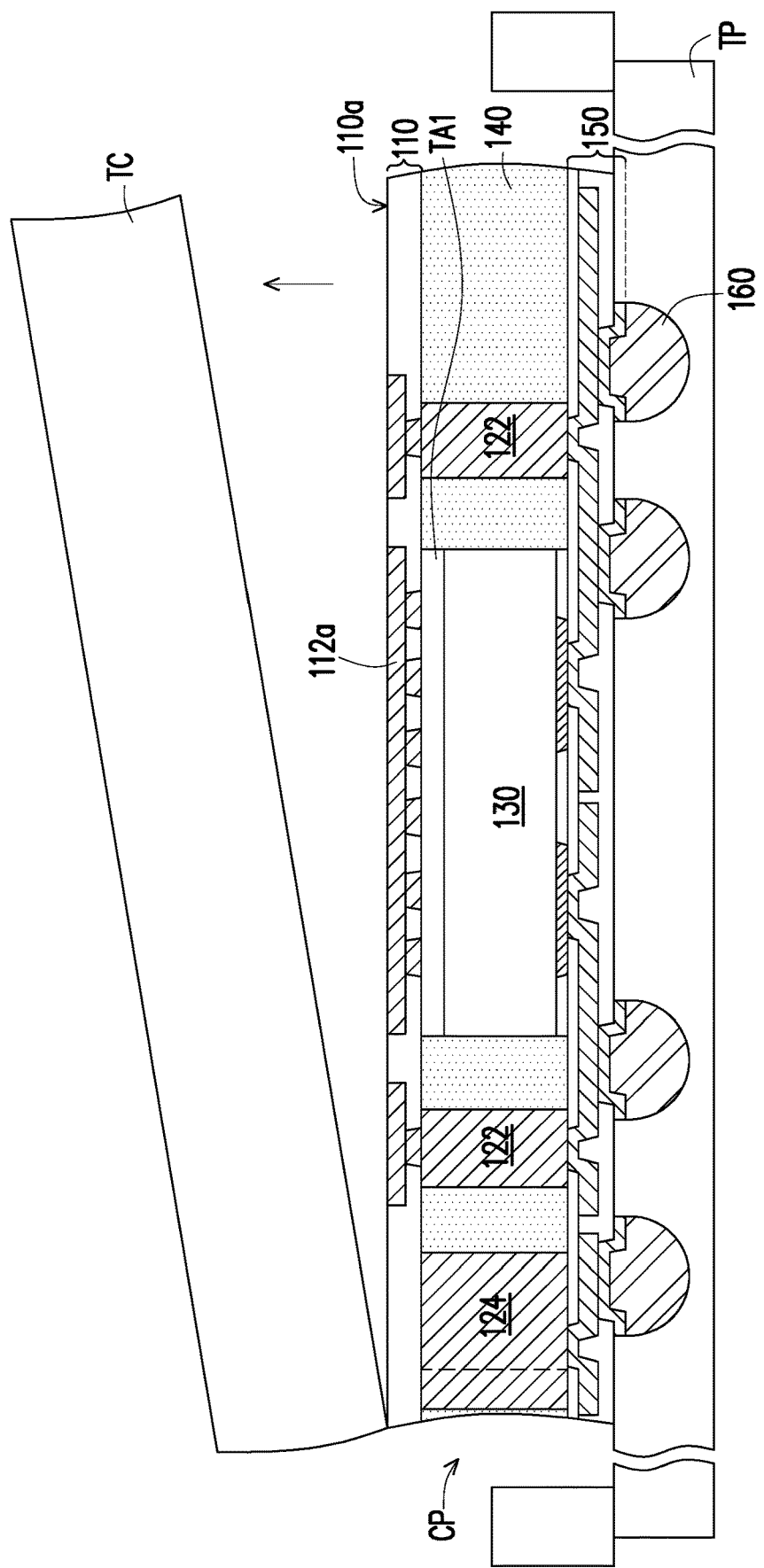
Figure 1H:
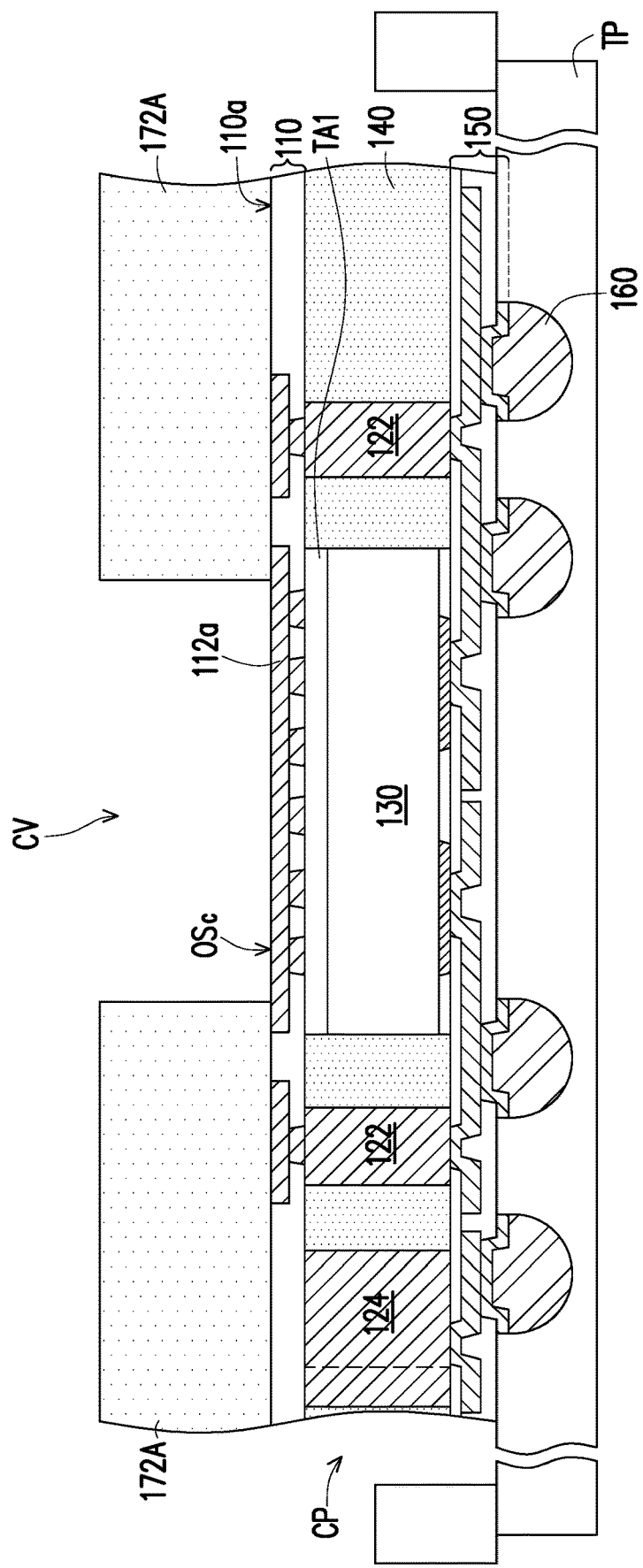
Figure 1I:
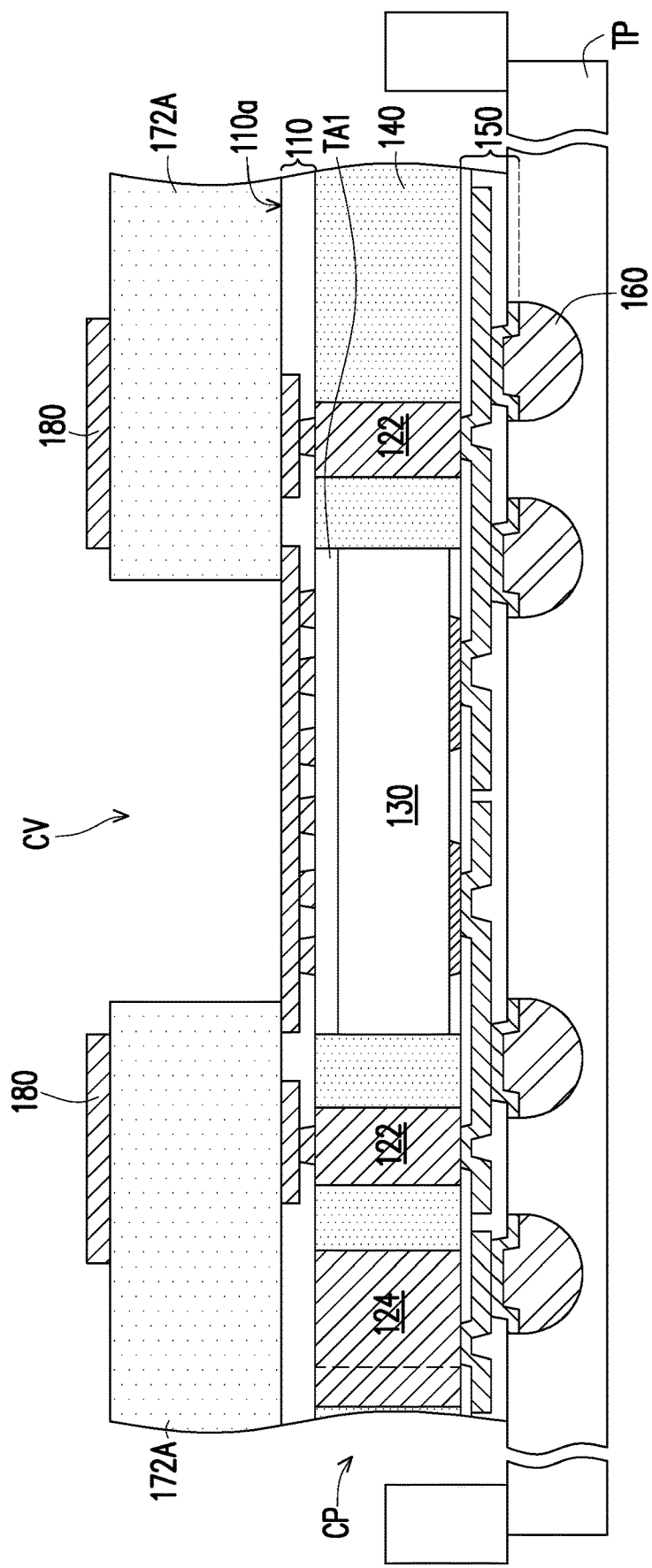
Figure 1J:
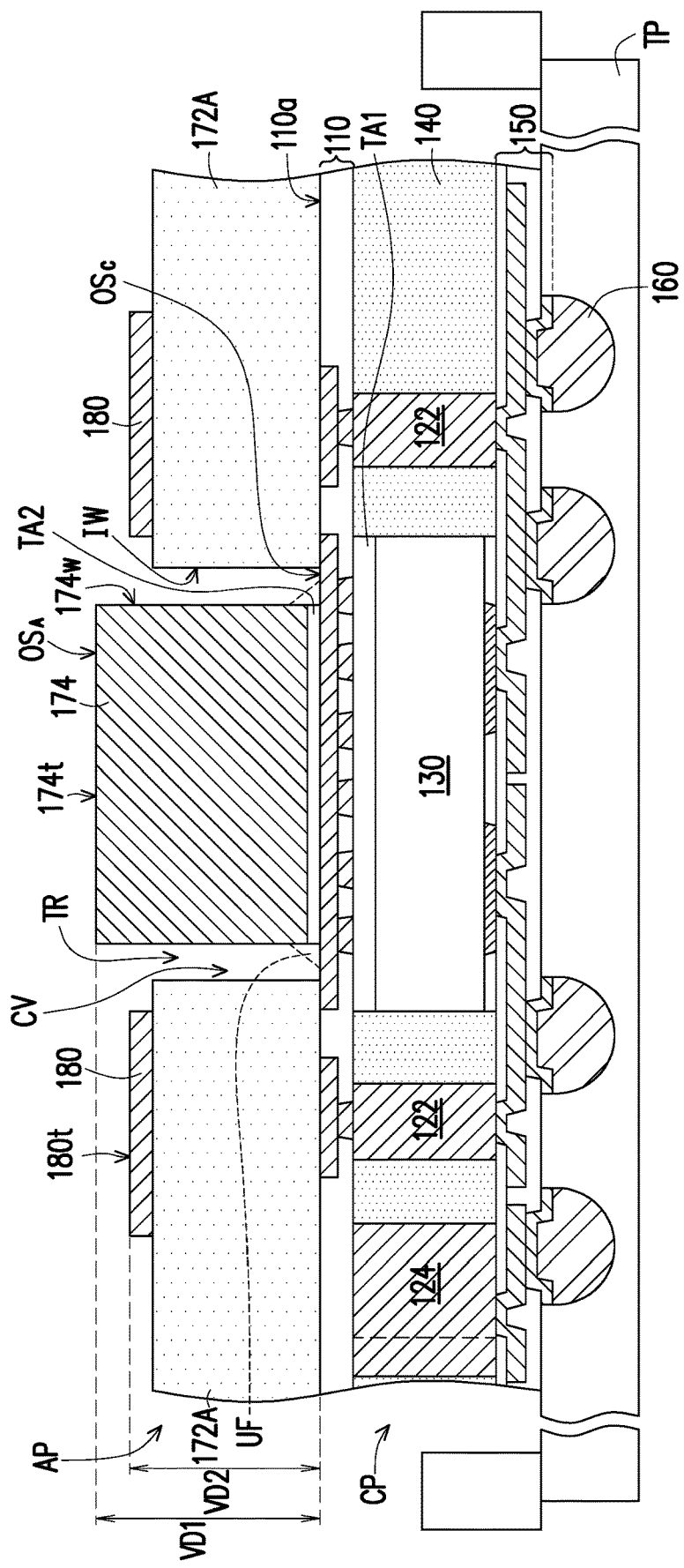
Figure 1K:
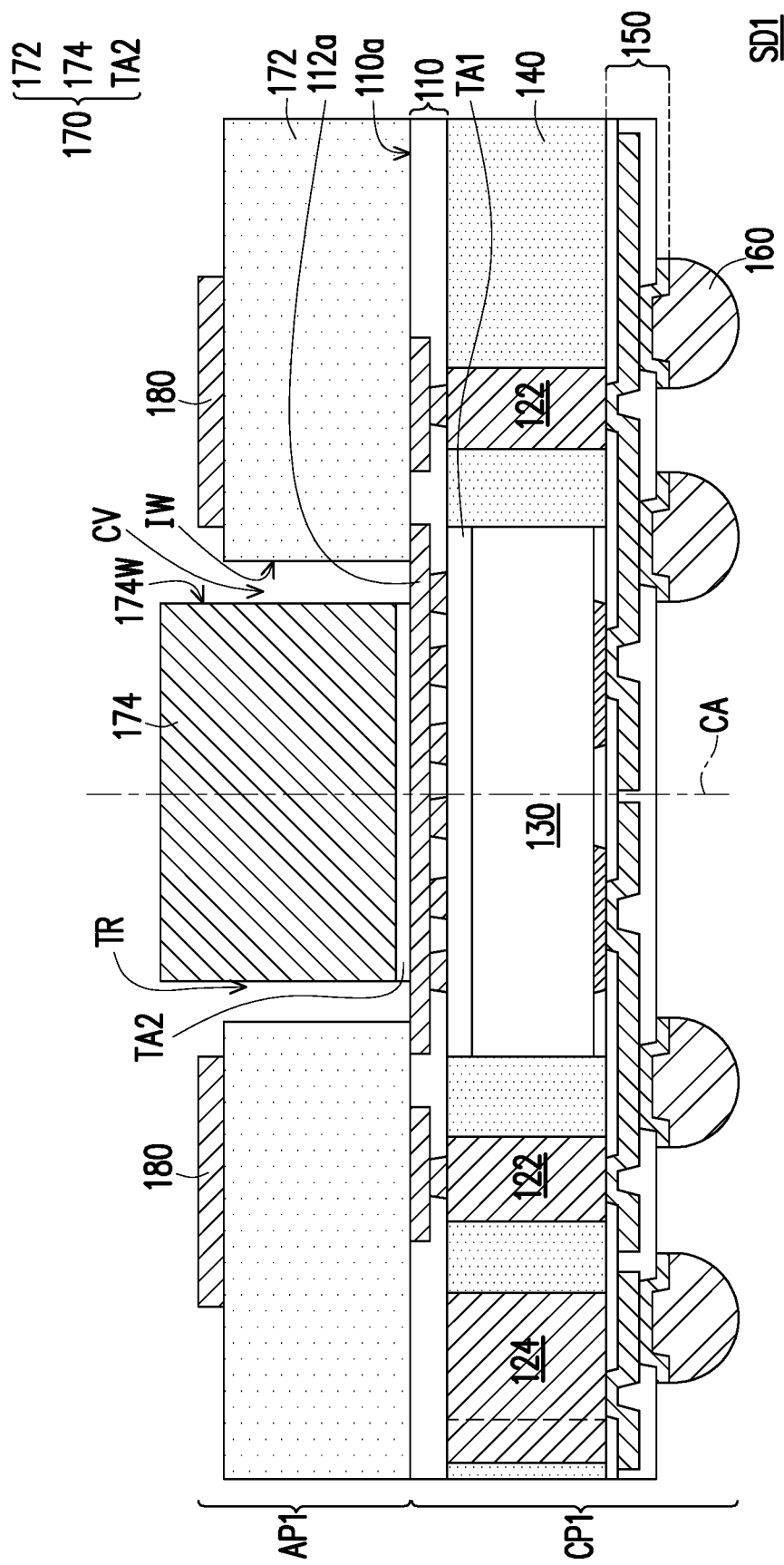
Figure 2:
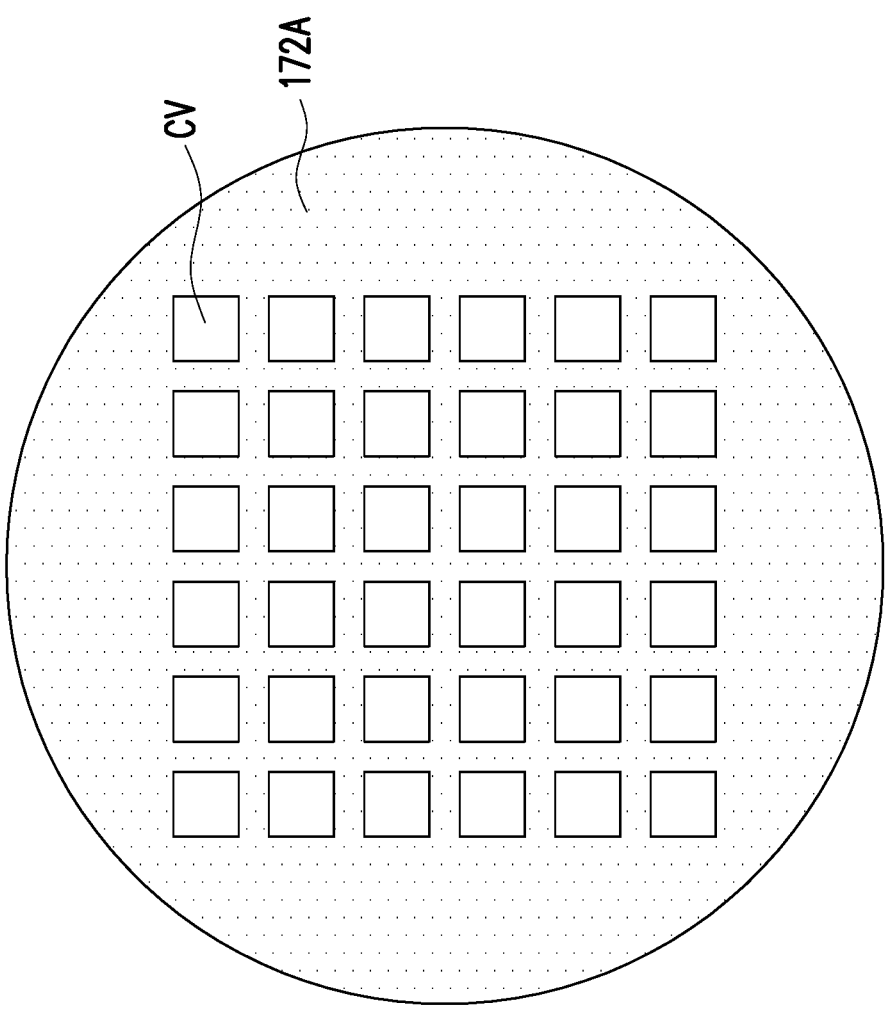
FIG. 2 is a schematic top view of a patterned dielectric layer in accordance with some exemplary embodiments of the disclosure.
Figure 3:
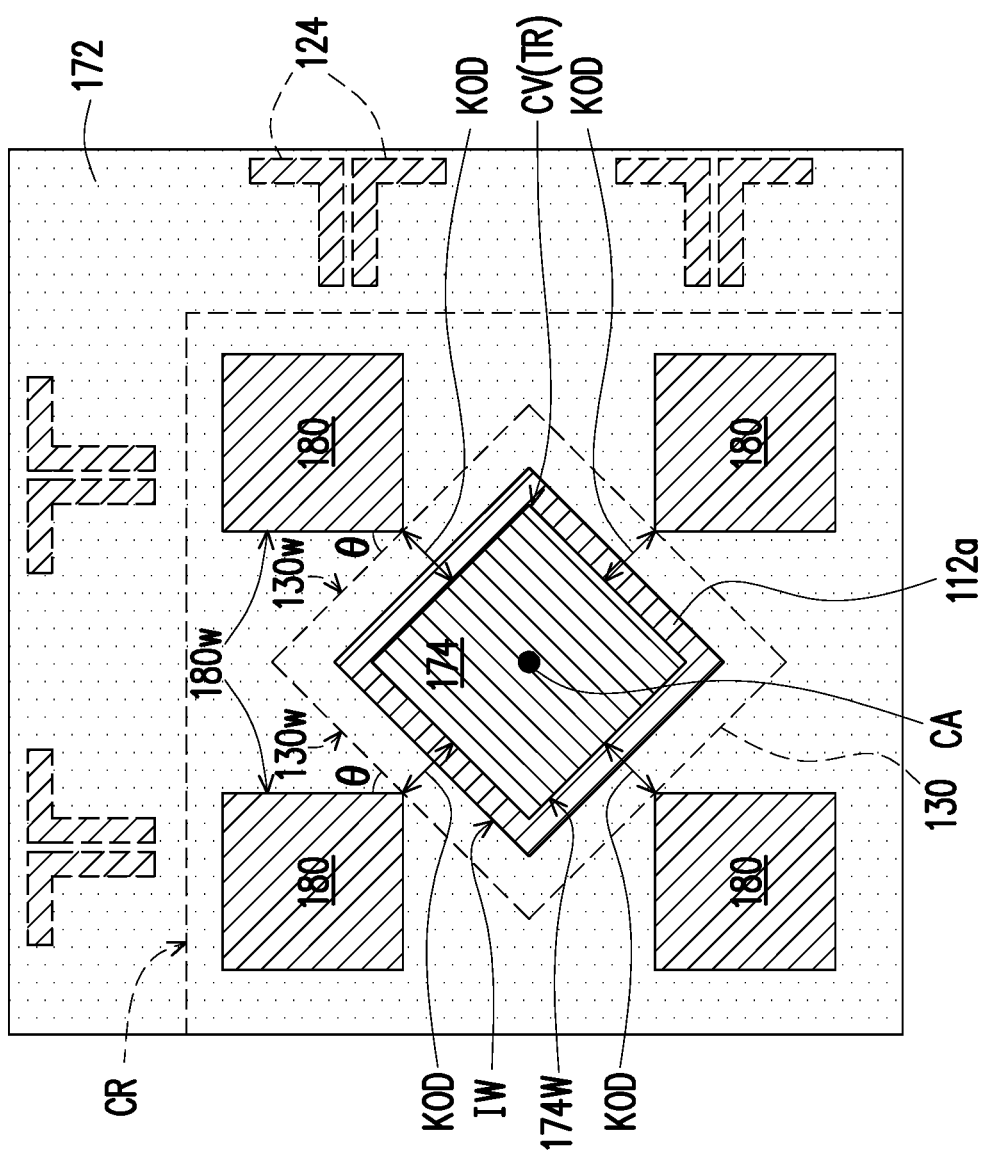
FIG. 3 is a schematic top view of a semiconductor device in accordance with some exemplary embodiments of the disclosure.

FIG. 1A to FIG. 1K are schematic cross-sectional views of various stages of manufacturing a semiconductor device in accordance with some exemplary embodiments of the disclosure, FIG. 2 is a schematic top view of a patterned dielectric layer in accordance with some exemplary embodiments of the disclosure, and FIG. 3 is a schematic top view of a semiconductor device in accordance with some exemplary embodiments of the disclosure. Referring to 1A, a first redistribution structure 110 is formed on a temporary carrier TC. For example, a material of the temporary carrier TC includes metal, glass, ceramic, silicon, combinations thereof, multi-layers thereof, or other suitable carrier which can support the structure subsequently formed thereon. The first redistribution structure 110 may include a first patterned conductive layer 112 and a first patterned dielectric layer 114. The first patterned conductive layer 112 may be referred to as a redistribution circuit layer and may include various conductive features (e.g., patterns, lines, vias, pads, etc.). For example, the first patterned conductive layer 112 includes a conductive pattern 112a and a plurality of conductive vias 112b connected to the conductive pattern 112a. In some embodiments, the first patterned conductive layer 112 includes feed lines and a ground plane (not labeled). For example, the feed lines of the first patterned conductive layer 112 may be electrically connected to other subsequently formed through interlayer vias for signal transmission, and the ground plane of the first patterned conductive layer 112 may be electrically connected to a ground.

In some embodiments, the first redistribution 110 has a first surface 110a facing toward the temporary carrier TC, and a second surface 110b opposite to the first surface 110a. The conductive pattern 112a is disposed on the first surface 110a and may be accessibly revealed by the first patterned dielectric layer 114. The conductive vias 112b are disposed on the second surface 110b and may be accessibly revealed by the first patterned dielectric layer 114. In some embodiment, the conductive pattern 112a of the first patterned conductive layer 112 is formed on the temporary carrier TC, and then the first patterned dielectric layer 114 having a plurality of openings OP1 and OP2 is formed on the conductive pattern 112a to expose at least a portion of the conductive pattern 112a. Afterwards, a plurality of conductive vias 112b of the first patterned conductive layer 112 is formed in the openings OP1 and OP2 of the first patterned dielectric layer 114 to be in physical and electrical contact with the underlying conductive pattern 112a.

In an exemplary embodiment, the conductive pattern 112a is formed by depositing the seed layer (not shown), forming a photoresist layer with openings (not shown) on the seed layer, depositing a conductive material (e.g., copper, aluminum, gold, nickel, silver, palladium, tin, or the like; not shown) on the seed layer and inside the openings of the photoresist layer, removing the photoresist layer, and etching the unmasked portion of the seed layer, etc. In such embodiments, the etched seed layer and the overlying conductive material in combination is viewed as the conductive pattern 112a. Next, a dielectric material (e.g., polybenzoxazole (PBO), polyimide (PI), benzocyclobutene (BCB), a combination thereof, or the like; not shown) may be formed over the temporary carrier TC to cover the conductive pattern 112a, and then a portion of the dielectric material may be removed using lithography and etching processes or other suitable removing process, such that the first patterned dielectric layer 114 with the openings OP1 and OP2 is formed. The openings OP1 and OP2 may accessibly reveal at least a portion of the underlying conductive pattern 112a. A portion of the openings (e.g., OP1) may be distributed at a predetermined region for the subsequently formed through interlayer vias (as illustrated in FIG. 1B). Another portion of the openings (e.g., OP2) may be distributed at another predetermined region where a semiconductor chip will be subsequently mounted onto (as illustrated in FIG. 1C). The opening size (e.g., diameter, depth) may be similar to the opening size of one of the openings OP2. In other embodiments, the openings OP1 and OP2 are of different sizes depending on the design requirements for better electrical and/or thermal conduction.

Subsequently, a conductive material is formed in the openings OP1 and OP2 of the first patterned dielectric layer 114 and on the conductive pattern 112a to form the conductive vias 112b of the first patterned conductive layer 112 using, for example, plating, sputtering, or other suitable deposition methods. The sidewalls of the conductive vias 112b may be tapered toward the conductive pattern 112a. Alternatively, the sidewalls of the conductive vias 112b are substantially vertical depending on the forming method of the openings OP1 and OP2. A planarization process is optionally performed to remove excess amount of the conductive material after depositing the conductive material. It should be noted that the foregoing sequence merely serves as an illustrative example, and the disclosure is not limited thereto. In alternative embodiments, the first patterned dielectric layer 114 is formed on the temporary carrier TC prior to forming the first patterned conductive layer 112. In addition, the number of the patterned dielectric layer and/or the patterned conductive layer may depend on the circuit design, which is not limited thereto.

Referring to 1B, one or more first through interlayer vias (TIVs) 122 are formed on the second surface 110b of the first redistribution structure 110. The first TIVs 122 may be in physical and electrical contact with the conductive vias 112b formed in the openings OP1 of the first patterned dielectric layer 114. In some embodiments, one or more second TIVs 124 are formed on the first patterned dielectric layer 114 of the first redistribution structure 110 aside the first TIVs 122. For example, the second TIVs 124 are formed during the formation of the first TIVs 122. In an exemplary embodiment, the method of forming the first TIVs 122 and the second TIVs 124 includes the following steps. A patterned mask layer (not shown) having openings may be formed on the first redistribution structure 110. The openings of the patterned mask layer may expose at least a portion of the conductive vias 112b and a portion of the first patterned dielectric layer 114 at predetermined regions for the subsequently formed TIVs. Next, a conductive material (e.g., titanium, tungsten, aluminum, copper, metal alloys, metal silicide, other suitable materials, and/or combinations thereof, or the like) may be formed into the openings of the patterned mask layer to form the first TIVs 122 and the second TIVs 124 using, for example, chemical vapor deposition (CVD), physical vapor deposition (PVD), atomic layer deposition (ALD), plating, other suitable methods, and/or combinations thereof. The first TIVs 122 are in physical and electrical contact with the conductive vias 112b of the first redistribution structure 110 and the second TIVs 124 may be in physical contact with the first patterned dielectric layer 114. After forming of the first TIVs 122 and the second TIVs 124, the patterned mask layer may be removed such that the structure as shown in FIG. 1B is achieved. It should be noted that the configurations of the first TIVs 122 and the second TIVs 124 are not limited by the illustration presented in FIG. 1B. Alternatively, the first TIVs 122 and/or the second TIVs 124 are pre-formed and may be disposed on the first redistribution structure 110 using a pick and place process.

In some other embodiments, the first TIVs 124 and the underlying conductive vias 112b of the first redistribution structure 110 are plated during the same process. In some embodiments, the second TIVs 124 are arranged to form a plurality of dipole antennas. The second TIVs 124 may have a dimension (e.g., width or length) greater than that of the first TIVs 122. However, the present disclosure is not limited thereto. Alternatively, the second TIVs 124 may have the dimension substantially equal to or less than that of the first TIVs 122. In some embodiments, each of the dipole antennas formed by the second TIVs 124 includes two L-shaped dipole arms, and these dipole antennas may be disposed on an outer circumferential region CR, as shown in FIG. 3. The dashed lines on the second TIVs 124 throughout the cross-sectional views indicate the turning interface of the L-shaped dipole arms. In some embodiments, the dipole arms are identical conductive elements that are bilaterally symmetrically arranged to form the dipole antenna. It is appreciated that the shape of the dipole arm and the configuration of the dipole antennas shown herein merely serve as an illustrative example, and the disclosure is not limited thereto.

Referring to 1C, a semiconductor chip 130 is disposed on the first redistribution structure 110. The semiconductor chip 130 includes a semiconductor substrate 132, a plurality of conductive pads 134 disposed on the semiconductor substrate 132, and a passivation layer 136 disposed on the semiconductor substrate 132 and accessibly revealing at least a portion of the conductive pads 134. In some embodiments, the passivation layer 136 includes contact openings 136a that partially expose the conductive pads 134. For example, the passivation layer 136 may cover the circumferences of the conductive pads 134. The semiconductor substrate 132 may be a silicon substrate including active components (e.g., transistors, or the like) and passive components (e.g., resistors, capacitors, inductors, or the like) formed therein. The conductive pads 134 may be aluminum pads, copper pads, or other suitable metallic pads. The passivation layer 136 may include stacked multi-sublayers including a silicon oxide layer, a silicon nitride layer, a polyimide (PI) layer, a polybenzoxazole (PBO) layer, or a dielectric layer formed by other suitable polymers.

In some embodiments, the semiconductor chip 130 may be a radio frequency (RF) integrated circuit chip. In alternative embodiments, the semiconductor chip 130 may include an application-specific integrated circuit (ASIC) chip, a sensor chip, a micro-electro mechanical system (MEMS) chip, or other suitable types of chip(s). It should be noted that the number of the semiconductor chip packaged in a chip package of a semiconductor device can be one or more, additional chip(s) may be provided and disposed aside the semiconductor chip 130. The additional chip(s) and the semiconductor chip 130 may be the same type or different types. In other embodiments, one or more semiconductor chip(s) 130 are picked and placed on the first redistribution structure 110 before forming the first TIVs 122 and/or the second TIVs 124.

In some embodiments, the semiconductor chip 130 and the first redistribution structure 110 are in thermal connection. For example, a first thermal conductive adhesive TA1 is formed on the second surface 110b of the first redistribution structure 110 at the predetermined region for the subsequently disposed semiconductor chip. After disposing the semiconductor chip 130, the first thermal conductive adhesive TA1 may be in physical contact with a rear surface 130r of the semiconductor chip 130 (e.g., opposite to the conductive pads 134) and the conductive vias 112b formed in the openings OP2 of the first patterned dielectric layer 114. The first thermal conductive adhesive TA1 may include conductive and/or thermal material(s) for improving electrical and/or thermal conduction between the semiconductor chip 130 and the first redistribution structure 110. In some embodiments, the first thermal conductive adhesive TA1 is a thermal paste including a viscous, silicone compound similar to the mechanical properties of grease or gel, and may be dispensed or printed on the second surface 110b of the first redistribution structure 110. In some embodiments, the first thermal conductive adhesive TA1 is a metal-based thermal paste containing silver, nickel, or aluminum particles suspended in the silicone grease. In other embodiments, the first thermal conductive adhesive TA1 includes non-electrically conductive, ceramic-based pastes filled with heat-conductive fillers. A material of the heat-conductive fillers may include aluminum nitride (AlN), aluminum oxide ($Al_2O_3$), zinc oxide (ZnO), beryllium oxide (BeO), etc. In other embodiments, the first thermal conductive adhesive TA1 may be a thermal tape or a thermal epoxy. A thermal conductivity of the first thermal conductive adhesive TA1 may be in a range of about 5 W/m-K to about 40 W/m-K. In some embodiments, the thermal conductivity of the first thermal conductive adhesive TA1 is about 25 W/m-K. Alternatively, the semiconductor chip 130 may be bonded to the first redistribution structure 110 through a die attach film.

Referring to 1D, an encapsulation 140 is formed on the first redistribution structure 110 to laterally wrap around the semiconductor chip 130, the first TIVs 122, and the second TIVs 124. In an exemplary embodiment, the method of forming the encapsulation 140 includes at least the following steps. An insulating material (not shown) is formed on the second surface 110b of the first redistribution structure 110 to cover the semiconductor chip 130, the first TIVs 122, and the second TIVs 124 using, for example, compression molding, transfer molding, or other suitable techniques. The insulating material includes a molding compound (e.g., epoxy resins), a molding underfill, a dielectric material (e.g., polybenzoxazole (PBO), polyimide (PI), benzocyclobutene (BCB), a combination thereof), or other suitable electrically insulating materials. For example, the insulating material includes a base material (e.g., a polymer, a resin, an epoxy, or the like) and a plurality of filler particles (e.g., dielectric particles of $SiO_2$, $Al_2O_3$, silica, etc.) distributed in the base material. Alternatively, the insulating material may include heat-conductive fillers distributed in the base material for improving thermal conductivity as will be described in greater details later in other embodiments.

Next, a thinning process may be performed on the insulating material to partially remove the insulating material to form the encapsulation 140. After thinning, at least a portion of the conductive pads 134 of the semiconductor chip 130, a portion of the first TIVs 122, and a portion of the second TIVs 124 may be accessibly revealed by the encapsulation 140 for further electrical connection. In some embodiments, during the thinning process, a portion of the passivation layer 136 covering the circumferences of the conductive pads 134 may be removed along with the insulating material. The thinning process may include a chemical-mechanical polish (CMP) process, a mechanical grinding process, or the like. The surface that the conductive pads 134 are accessibly revealed may be referred to as an active surface 130a of the semiconductor chip 130. In some embodiments, the encapsulation 140, the semiconductor chip 130, and the first and second TIVs 122 and 124 are planarized. For example, a top surface 140t of the encapsulation 140 is substantially coplanar with the active surface 130a of the semiconductor chip 130, the top surfaces 122t of the first TIVs 122, and the top surfaces 124t of the second TIVs 124. It should be noted that the foregoing sequence merely serves as an illustrative example, and the disclosure is not limited thereto. Alternatively, the semiconductor chip 130 is initially disposed on the first redistribution structure 110, and then the insulating material is formed on the first redistribution structure 110 to cover the semiconductor chip 130. Subsequently, a plurality of through holes may be formed in the insulating material, and then the conductive material may be formed in the through holes to form the first and second TIVs 122 and 124.

Referring to 1E, a second redistribution structure 150 is formed on the encapsulation 140, the first and second TIVs 122 and 124, and the semiconductor chip 130. For example, the second redistribution structure 150 includes at least one second patterned dielectric layer (e.g., 152a, 152b) and at least one second patterned conductive layer (e.g., 154a, 154b) stacked alternatively. In some embodiments, given the placements in the structure, the first redistribution structure 110 is referred to as a backside redistribution structure, and the second redistribution structure 150 is referred to as a front side redistribution structure. The semiconductor chip 130 may be electrically coupled to the first redistribution structure 110 through the second redistribution structure 150 and the first TIVs 122.

In an exemplary embodiment, the method of forming the second redistribution structure 150 includes at least the following steps. A dielectric material is formed on the top surface 140t of the encapsulation 140, the active surface 130a of the semiconductor chip 130, the top surfaces 122t of the first TIVs 122, and the top surfaces 124t of the second TIVs 124. A portion of the dielectric material is removed to form the bottommost one of the second patterned dielectric layers 152a with openings using, for example, lithography and etching processes, drilling process, or other suitable techniques. Next, the bottommost one of the second patterned conductive layers 154a is formed on the surface of the second patterned dielectric layer 152a, and also formed inside the openings of the second patterned dielectric layer 152a to be in electrical and physical contact with the first TIVs 122, the second TIVs 124, and the conductive pads 134 of the semiconductor chip 130 using any suitable patterning and metallization processes. For example, the second patterned conductive layer 154a is formed by depositing the seed layer (not shown), forming a photoresist layer with openings (not shown) on the seed layer, depositing the conductive material (e.g., copper, aluminum, gold, nickel, silver, palladium, tin, etc.) on the seed layer and inside the openings of the photoresist layer, removing the photoresist layer, and etching the unmasked portion of the seed layer, etc. The abovementioned steps may be performed multiple times to obtain a multi-layered redistribution structure as required by the circuit design. In some embodiments, the topmost one of the second patterned conductive layers 154b includes under-ball metallurgy (UBM) pattern for the subsequent ball-mounting process. Alternatively, the second patterned conductive layer may be formed prior to the formation of the second patterned dielectric layer. In addition, the numbers of the second patterned dielectric layer and the second patterned conductive layer may be selected based on demand, which are not limited in the disclosure.

Referring to 1F, one or more conductive terminals 160 are formed on the topmost one of the second patterned conductive layers 154b. The conductive terminals 160 may be electrically coupled to the semiconductor chip 130 through the second redistribution structure 150. In some embodiments, the conductive terminals 160 include conductive materials with low resistivity, such as Sn, Pb, Ag, Cu, Ni, Bi, or an alloy thereof. The conductive terminals 160 may be solder balls, ball grid array (BGA) balls, or other suitable conductive materials formed in other shapes. For example, the conductive terminals 160 are disposed on the UBM pattern of the second patterned conductive layer 154b using a ball placement process and an optional reflow process. It should be noted that the number, the dimension, and the shape of the conductive terminals 160 are provided for illustrative purposes, which construe no limitation in the disclosure.

Referring to 1G, after the conductive terminals 160 are formed, the temporary carrier TC may be detached from the first surface 110a of the first redistribution structure 110. Up to here, the manufacture of a chip package CP is substantially completed. In some embodiments, the chip package CP may be referred to as an integrated fan-out (InFO) package. The conductive pattern 112a of the first redistribution structure 110 disposed at an outermost side of the chip package CP is accessibly revealed. In some embodiments, the chip package CP can be overturned (e.g., flipped upside down), and then disposed on a tape TP for further processing on the first surface 110a of the first redistribution structure 110. For example, the tape TP is applied to the conductive terminals 160 for supporting the structure on the tape TP during the subsequent processes.

After forming the chip package CP, an antenna package (e.g., AP labeled in FIGS. 1J and 1K) is formed on the chip package CP. In an exemplary embodiment, the method of forming the antenna package AP includes at least the following steps. Referring to FIG. 1H and FIG. 2, a patterned dielectric layer 172A with a cavity CV is formed on the first surface 110a of the first redistribution structure 110. In some embodiments, the patterned dielectric layer 172A with the cavity CV (or through holes) is pre-formed using a mechanical process such as punching, drilling, or other suitable patterning methods. The patterned dielectric layer 172A may be a dry film and may be laminated onto the first surface 110a of the first redistribution structure 110. In other embodiments, a dielectric material is formed on the first surface 110a of the first redistribution structure 110, and then a portion of the dielectric material is removed to form the patterned dielectric layer 172A with the cavity CV using lithography and etching processes or other suitable patterning methods.

At least a portion of the conductive pattern 112a disposed at the outermost side $OS_C$ of the chip package CP may be accessibly revealed by the cavity CV of the patterned dielectric layer 172A. The cavity CV may correspond to the underlying semiconductor chip 130 of the chip package CP. For example, a vertical projection (a projection along a direction perpendicular to the first surface 110a of the first redistribution structure 110) of the cavity CV onto the first surface 110a of the first redistribution structure 110 is overlapped with a vertical projection of the semiconductor chip 130 onto the first surface 110a of the first redistribution structure 110. The vertical projection of the cavity CV onto the first surface 110a may be located within the vertical projection of the semiconductor chip 130 onto the first surface 110a. In other embodiments, the vertical projection of the cavity CV onto the first surface 110a is laterally offset with the vertical projection of the semiconductor chip 130 onto the first surface 110a. The thickness of the patterned dielectric layer 172A and the size of the cavity CV may vary depend on the device size, the process technology, the antenna efficiency, and the device application, etc.

In some embodiments, the patterned dielectric layer 172A is made of one or more low dissipation factor (or dielectric loss tangent, Df) and/or low permittivity (or dielectric constant, Dk) materials. In some embodiments, the patterned dielectric layer 172A is a polymer layer including a photosensitive material, such as polybenzoxazole (PBO), polyimide (PI), benzocyclobutene (BCB), a combination thereof, or the like. In some embodiments, the patterned dielectric layer 172A includes epoxy resins, or any suitable type of molding materials. Depending on the frequency range of high-speed applications, suitable materials of the patterned dielectric layer 172A may be selected based on the required electrical properties of the semiconductor device. In some embodiments, the aforementioned formation of the chip package CP may take a wafer form and the patterned dielectric layer 172A with a plurality of cavities CV may be provided at the wafer level in compliance with the chip package CP. The cavities CV may correspond to the underlying semiconductor chip 130 of the chip package CP to be arranged in an array as shown in FIG. 2. As such, the process complexity may be sufficiently reduced. Alternatively, the patterned dielectric layer 172A may be provided at different levels (e.g., panel level, chip level, strip level, etc.) depending on the requirement of processing operations.

Referring to 1I, an antenna pattern 180 is provided on the patterned dielectric layer 172A opposite to the first redistribution structure 110. The antenna pattern 180 may be electrically coupled to the chip package CP. In some embodiments, the antenna pattern 180 is a patch antenna. Other types of antenna (e.g., a ring antenna, a rectangular loop antenna, monopole antennas, etc.) may be used depending on the device applications and/or frequency of operations. In some embodiments, the antenna pattern 180 is arranged in the form of an array on the patterned dielectric layer 172A and surrounding the cavities CV. The size of the array for the antenna pattern 180 can be designated and selected based on the demand, and is not limited to the disclosure. In certain embodiments, the antenna pattern 180 includes conductive blocks arranged in the array as shown in a top view of FIG. 3. The shapes of the conductive blocks of the antenna pattern 180 may be square, rectangular, round, elliptical, oval, tetragonal, hexagonal, octagonal, or any suitable polygonal shape.

In some embodiments, the antenna pattern 180 is formed on the patterned dielectric layer 172A through a printing process, a dispensing process, a spraying process, etc. For example, a patterned mask having apertures (e.g., stencil or screen; not shown) is placed over the patterned dielectric layer 172A, and then a conductive paste (e.g., copper paste, silver paste, or the like) is applied onto the patterned dielectric layer 172A through the apertures of the patterned mask. A curing process is optionally performed to cure the applied conductive paste so as to form the antenna pattern 180. In certain embodiments in which the antenna pattern 180 is made of copper paste and the second patterned conductive layer (e.g., 154a, 154b; labeled in FIG. 1E) of the second redistribution structure 150 are made of plated copper, the copper density of the second patterned conductive layer (e.g., 154a, 154b) of the second redistribution structure 150 is denser than that of the antenna pattern 180. Other suitable techniques (e.g., plating, laminating) may be utilized to form the antenna pattern 180. In alternative embodiments, the patterned dielectric layer 172A and the antenna pattern 180 are pre-formed, and then disposed on the chip package CP.

Referring to FIG. 1J, a plurality of protrusions 174 is disposed on the first surface 110a of the first redistribution structure 110 and accommodated in each of the cavities CV of the patterned dielectric layer 172A. In some embodiments, the chip package CP and the protrusions 174 are in thermal connection. The shape of the protrusion 174 includes a cubic shape, a cylindrical shape, a polygonal column shape, or other suitable shape. In some embodiments, the protrusion 174 is a ceramic protrusion. For example, a material of the protrusion 174 includes fine ceramics, such as aluminum nitride (AlN), silicon carbide (SiC), aluminum oxide ($Al_2O_3$), silicon nitride ($Si_3N_4$), boron nitride (BN), zirconia ($ZrO_2$), or other suitable materials that aids heat dissipation. In some embodiments, a second thermal conductive adhesive TA2 is formed on the first surface 110a of the first redistribution structure 110 and inside each of the cavities CV of the patterned dielectric layer 172A so as to be in physical contact with the outermost side $OS_C$ of the chip package CP. The material and the forming process of the second thermal conductive adhesive TA2 may be similar to those of the second thermal conductive adhesive TA2, and the detailed descriptions are omitted for brevity. Subsequently, the protrusions 174 is picked and placed onto the second thermal conductive adhesive TA2. In other embodiments, the protrusion 174 is initially provided with the second thermal conductive adhesive TA2, and then the protrusion 174 is placed in the cavity CV and bonded to the chip package CP through the second thermal conductive adhesive TA2.

After disposing the protrusion 174, the protrusion 174 is protruded from the top surface of the patterned dielectric layer 172A. A top surface 174t of the protrusion 174 may be located at the outermost side $OS_A$ of the antenna package AP. For example, a first vertical distance VD1 from the top surface 174t of the protrusion 174 to the first surface 110a of the first redistribution structure 110 is greater than a second vertical distance VD2 from a top surface 180t of the antenna pattern 180 to the first surface 110a of the first redistribution structure 110. Alternatively, the first vertical distance VD1 is substantially equal to or less than the second vertical distance VD2. In some embodiments, the protrusion 174 may be aligned and placed in the cavity CV to form a trench TR between the patterned dielectric layer 172A and the protrusion 174. The trench TR may surround the protrusion 174. For example, the trench TR is defined by the inner sidewalls IW of the patterned dielectric layer 172A corresponding to the cavity CV, the sidewalls 174W of the protrusion 174, and the first surface 110a of the first redistribution structure 110. In some embodiments, an underfill UF is formed on the first surface 110a of the first redistribution structure 110 within the trench TR to wrap around at least the bottom of the sidewalls 174W of the protrusion 174, thereby improving the adhesion between the protrusion 174 and the chip package CP. In other embodiments, the underfill UF is omitted. Thus, the underfill UF in FIG. 1J is illustrated in dashed lines so as to indicate that the underfill UF may be or may not be present, and the underfill is omitted in other drawings.

Referring to FIG. 1K and FIG. 3, after forming the antenna package AP, the tape TP is removed and the structure illustrated in FIG. 1J may undergo a singulation process to form the a plurality of semiconductor devices SD1. For example, a singulation process may be performed along singulation lines (not shown) on the patterned dielectric layer 172A, the first redistribution structure 110, the encapsulation 140, and the second redistribution structure 150 to obtain the semiconductor device SD1. The semiconductor device SD1 includes the singulated chip package CP1 and the singulated antenna package AP1 stacked on the singulated chip package CP1. The singulated chip package CP1 includes the first redistribution structure 110, the first TIVs 122 in physical and electrical contact with the first redistribution structure 110, the second TIVs 124 disposed aside the first TIVs 122, the semiconductor chip 130 electrically coupled to the first and second TIVs 122 and 124 and the antenna package AP1 and also being in thermal and electrical contact with the first redistribution structure 110, the encapsulation 140 laterally enclosing the semiconductor chip 130 and the first and second TIVs 122 and 124, the second redistribution structure 150 disposed on the encapsulation 140 and in physical and electrical contact with the semiconductor chip 130 and the first and second TIVs 122 and 124, and the conductive terminals 160 disposed on the second redistribution structure 150 and electrically coupled to the semiconductor chip 130 through the second redistribution structure 150. The singulated antenna package AP1 includes an intermediate structure 170 and the antenna pattern 180 disposed on the intermediate structure 170. The intermediate structure 170 includes a dielectric casing 172 (e.g., singulated from the patterned dielectric layer 172A), the protrusion 174 disposed in the cavity CV of the dielectric casing 172 and in thermal connection with the singulated chip package CP1, and the second thermal conductive adhesive TA2 interposed between the protrusion 174 and the conductive pattern 112a of the first redistribution structure 110 of the singulated chip package CP1. During the operation of the semiconductor device SD1, the heat generated from the semiconductor chip 130 may be dissipated through the first redistribution structure 110 and the protrusion 174, and also may be dissipated through the second redistribution structure 150 and the conductive terminals 160 to the external environment.

Continue to FIG. 3, it should be noted that the dashed elements shown in FIG. 3 indicate the elements in the singulated chip package CP1 (e.g., the semiconductor chip 130 and the dipole antenna formed by the second TIVs 124), and some of the elements are omitted for ease of understanding. In some embodiments, the inner sidewalls IW of the dielectric casing 172 are substantially parallel to the sidewalls 174W of the protrusion 174. The inner sidewalls IW of the dielectric casing 172 may be substantially parallel to the sidewalls 130w of the semiconductor chip 130. In some embodiments, the dipole antennas formed by the second TIVs 124 are disposed on the outer circumferential region CR of the singulated chip package CP1. The dipole arms are arranged along at least one edge of the singulated chip package CP1. For example, the dipole antennas are disposed along two connecting edges of the singulated chip package CP1. It should be noted that the configuration of the dipole antennas shown in FIG. 3 merely serves as an illustrative example, and other configuration of the dipole antennas is possible.

In some embodiments, the antenna pattern 180 is formed by a plurality of individual conductive blocks arranged in an array. It should be appreciated that a two-by-two array of the conductive blocks shown in FIG. 3 merely serves as an illustrative example, and the disclosure is not limited thereto. The top of each conductive block may have a substantially square shape or a rectangular shape with various sizes (e.g., surface areas), such as about 0.8 mm×about 0.6 mm, about 1.4 mm×about 1.0 mm, etc. Other sizes or shapes of the conductive blocks are possible. It should be noted that the conductive blocks of the antenna pattern 180 may be sized and shaped depending on antenna efficiency and operational frequency characteristics of the semiconductor device SD1.

Still referring to FIG. 3, a keep-out-distance KOD is a clearance defined by the protrusion 174 and the antenna pattern 180 for preventing or reducing interference with antenna pattern 180 in accordance with some embodiments. For example, the keep-out-distance KOD is a shortest distance from one of the sidewalls 174W of the protrusion 174 to the closest edge of one of the conductive blocks of the antenna pattern 180. The keep-out-distance KOD may range from about 500 μm to about 700 μm. For example, the keep-out-distance KOD is about 600 μm. It should be appreciated that the keep-out-distance KOD may be adjusted depending on the device size, the process technology, the antenna efficiency, and the device application, etc.

In some embodiments, the shortest distance between a central axis CA of the semiconductor chip 130 and each conductive block of the antenna pattern 180 may be substantially equal in the plan view. The semiconductor chip 130 may be configured to be rotated about the central axis CA by an angle θ relative to a sidewall direction of the antenna pattern 180. For example, the angle θ is measured between one of the sidewalls 130w of the semiconductor chip 130 and the closest one of the sidewalls 180w of the antenna pattern 180 in a plane view. The angle θ may be in a range between 0 and 90 degrees. In some embodiments, the semiconductor chip 130 may be disposed at about a 45 degree angle with respect to the sidewalls 180w of the antenna patterns 180 in the plane view. Other orientation of the semiconductor chip 130 is possible. In some embodiments, the central axis CA of the semiconductor chip 130 may be substantially coincident with a central axis of the protrusion 174.

Figure 4:
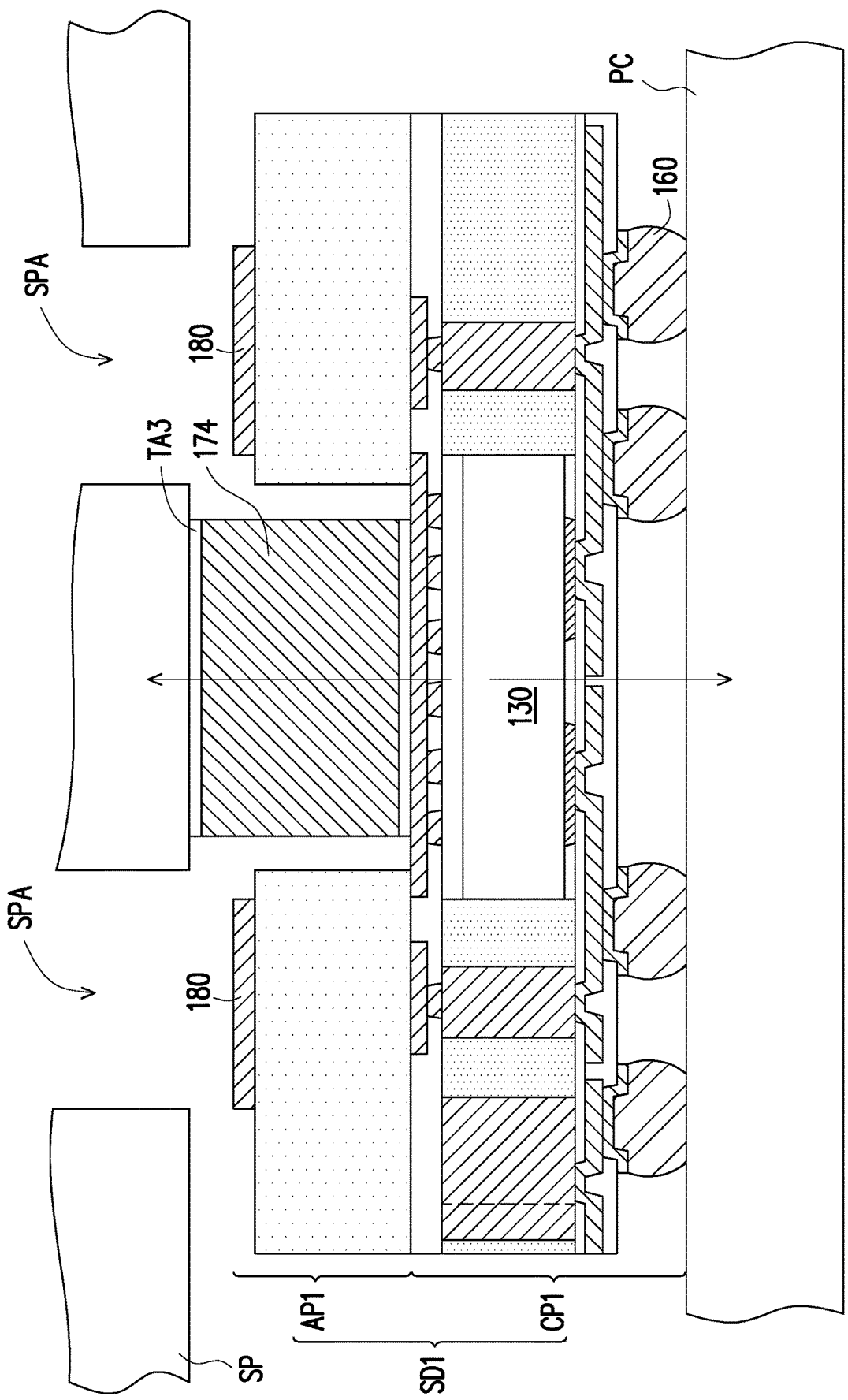
FIG. 4 is a schematic cross-sectional view of an application of a semiconductor device in accordance with some exemplary embodiments of the disclosure.

FIG. 4 is a schematic cross-sectional view of an application of a semiconductor device in accordance with some exemplary embodiments of the disclosure. Referring to FIG. 4, the semiconductor device SD1 may be mounted onto a package component PC. For example. the package component PC includes another chip package including the same or different types of semiconductor chip(s), a package substrate, an interposer, a printed circuit board (PCB), a mother board, a system board, etc. In some embodiments, the conductive terminals 160 of the semiconductor device SD1 are reflowed in order to be bonded on the contact pads (not shown) of the package component PC. In some embodiments, the semiconductor device SD1 is thermally coupled to a plate SP. For example, the plate SP leans against the protrusion 174 of the singulated antenna package AP1. In some embodiments, the plate SP is made of a heat-conductive material (e.g., a metal, a ceramic, a thermal plastic, etc.) that aids the heat dissipation efficiency of the semiconductor device SD1. A size of the plate SP may be larger than that of the semiconductor device SD1 so as to increase the heat dissipation efficiency. In certain embodiments in which the semiconductor device SD1 is attached to a liquid crystal display (LCD) module (not shown), the plate SP may be a shield plate of the LCD module. In other embodiments, the plate SP serves as a heat spreader, a heat sink, or the like.

For example, the plate SP is bonded to the protrusion 174 through a third thermal conductive adhesive TA3. The third thermal conductive adhesive TA3 interposed between the plate SP and the protrusion 174 may be similar to the first or second thermal conductive adhesive TA1 or TA2, and the detailed descriptions are omitted for brevity. The plate SP may include a plurality of apertures SPA, and the apertures SPA may expose the antenna pattern 180. In other words, the antenna pattern 180 is unmasked by the plate SP, so that the antenna performance does not be affected by the plate SP. In certain embodiments in which the package component PC is disposed on the singulated chip package side of the semiconductor device SD1 and the plate SP is disposed on the singulated antenna package side of the semiconductor device SD1, during operation, the heat generated from the semiconductor chip 130 may be conducted to the package component PC as the arrow pointing downwardly in FIG. 4, and also the heat may be conducted to the plate SP as the arrow pointing upwardly in FIG. 4. Thus, with multiple heat dissipation paths, the heat dissipation efficiency of the semiconductor device SD1 may be improved.

Figure 5:
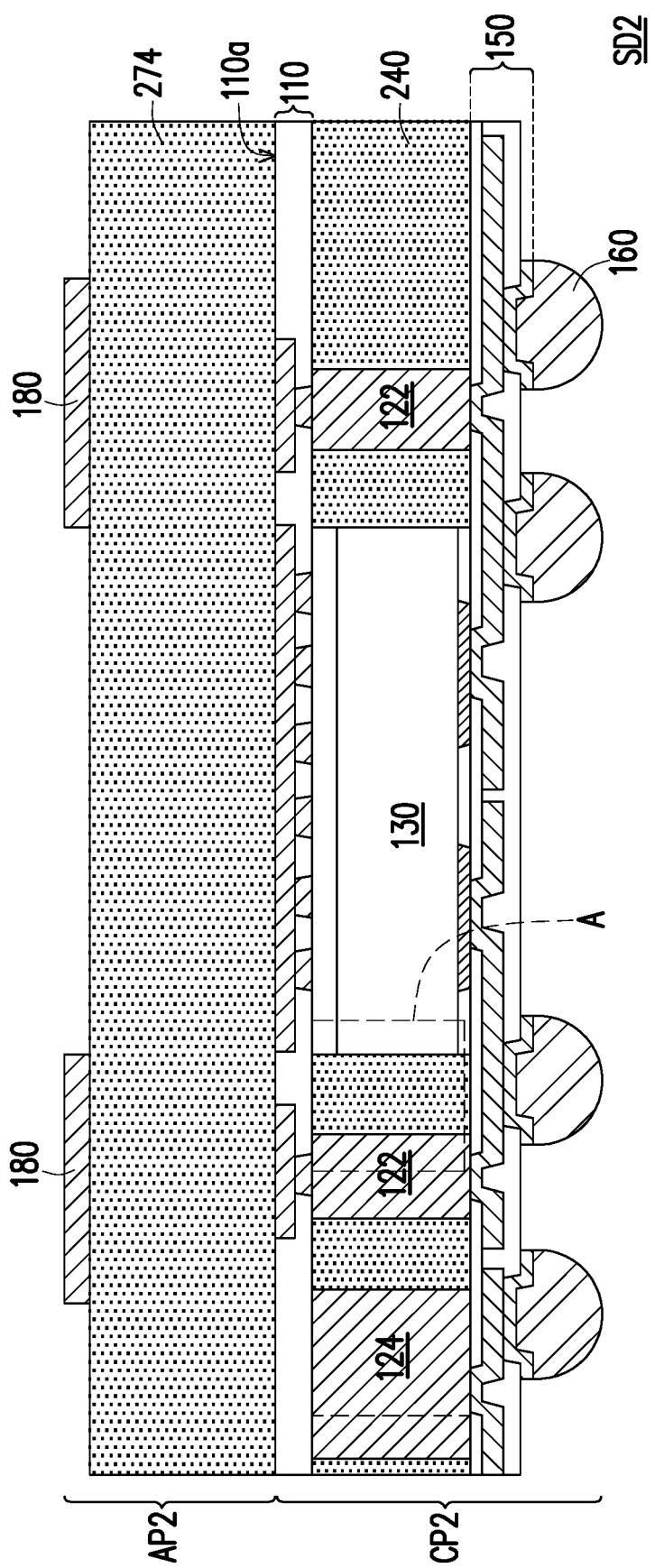
FIG. 5 is a schematic cross-sectional view of a semiconductor device in accordance with some exemplary embodiments of the disclosure.
Figure 6:
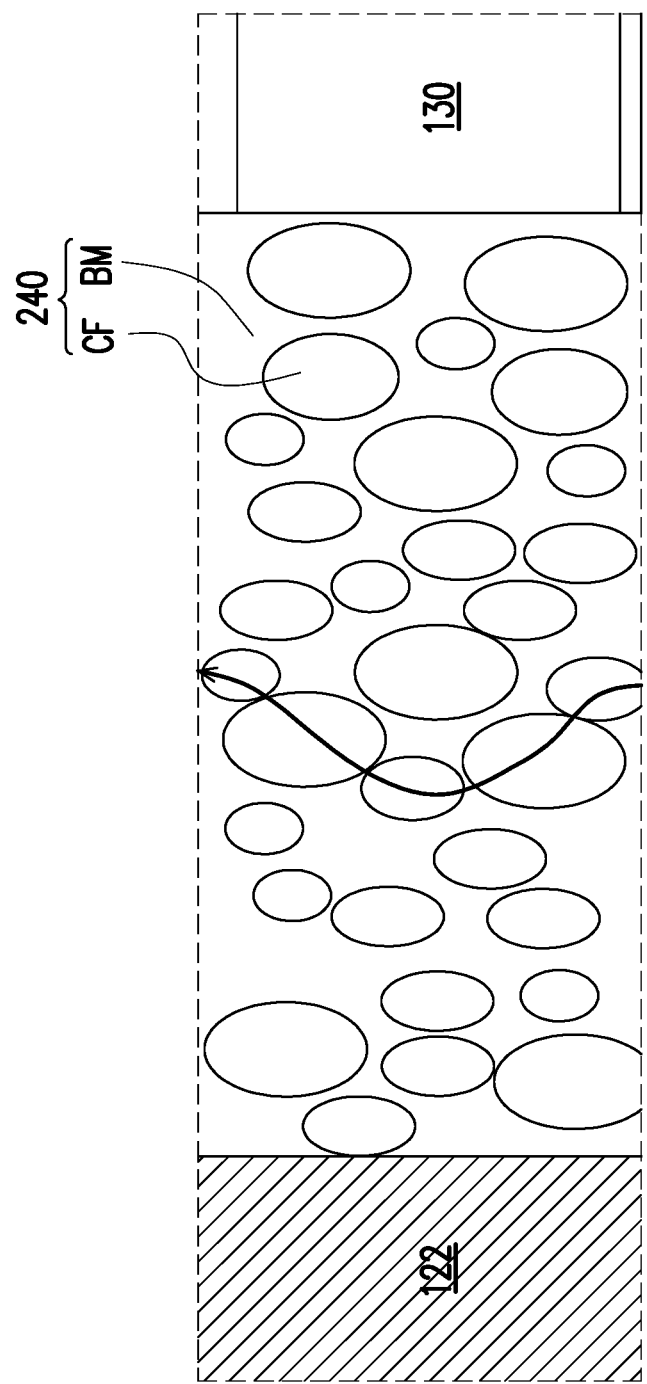
FIG. 6 is schematic, enlarged cross-sectional view illustrating the structure in the dashed box A depicted in FIG. 5 in accordance with some exemplary embodiments of the disclosure.

FIG. 5 is a schematic cross-sectional view of a semiconductor device in accordance with some exemplary embodiments of the disclosure, and FIG. 6 is schematic, enlarged cross-sectional view illustrating the structure in the dashed box A depicted in FIG. 5 in accordance with some exemplary embodiments of the disclosure. Referring to FIG. 5 and FIG. 6, a semiconductor device SD2 includes a chip package CP2 and an antenna package AP2 stacked thereon. The semiconductor device SD2 shown in FIG. 5 may be similar to the semiconductor device SD1 shown in FIG. 1K. Like elements in throughout the drawings are designated with the same reference numbers for ease of understanding and the details thereof are not repeated herein. For example, the encapsulation 240 of the chip package CP2 includes a base material BM (e.g., epoxy, polyimide, silicone, acrylic, or the like) and a plurality of heat-conductive fillers CF distributed in the base material BM. The heat-conductive fillers CF may include fine ceramic powders, such as aluminum nitride (AlN), aluminum oxide ($Al_2O_3$), silicon carbide (SiC), silicon nitride ($Si_3N_4$), boron nitride (BN), zirconia ($ZrO_2$), or other suitable heat-conductive particles. In some embodiments, the heat-conductive fillers CF are arranged as a path (e.g., the arrow shown in FIG. 6) for dissipating the heat generated from the semiconductor chip 130 through other thermal conductive elements in contact with the encapsulation 240 to the external environment. It should be noted that the path formed by the heat-conductive fillers CF may thermally dissipate the heat in multiple directions. The arrow shown in FIG. 6 is not intended to be limiting in any way, but instead is provided merely as an illustrative example.

In some embodiments, the intermediate structure 274 of the antenna package AP2 covers the entirety of the first surface 110a of the first redistribution structure 110. In other words, no cavity is formed in the intermediate structure 274. The intermediate structure 274 may be made of the material similar to that of the encapsulation 240. That is, the intermediate structure 274 includes the base material and the heat-conductive fillers arranged as a dissipation path in the base material for better thermal dissipation efficiency, and the detailed descriptions are omitted for brevity. Alternatively, the intermediate structure 274 is made of one or more low dissipation factor and/or low permittivity dielectric materials. The selected material of the intermediate structure 274 may be applied in the manufacture of high frequency and/or high speed communication products.

Figure 7A:
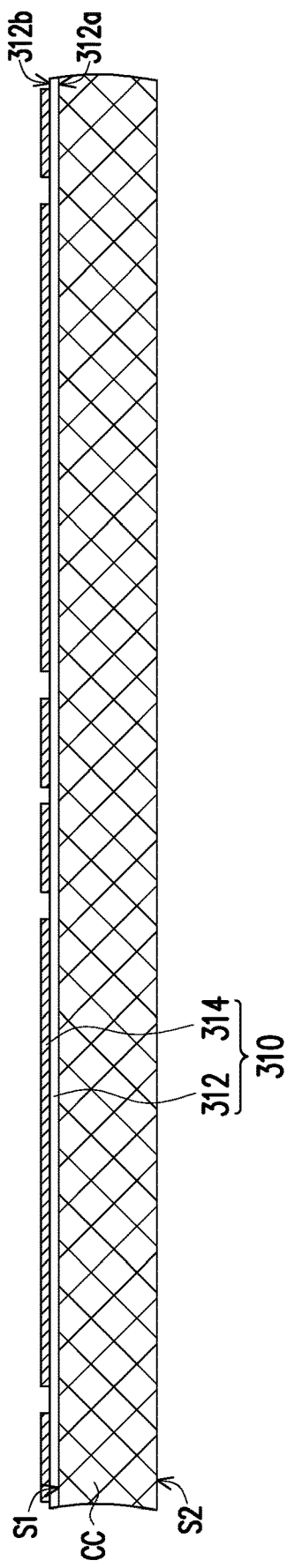
FIG. 7A to FIG. 7E are schematic cross-sectional views of various stages of manufacturing a semiconductor device in accordance with some exemplary embodiments of the disclosure.
Figure 7B:
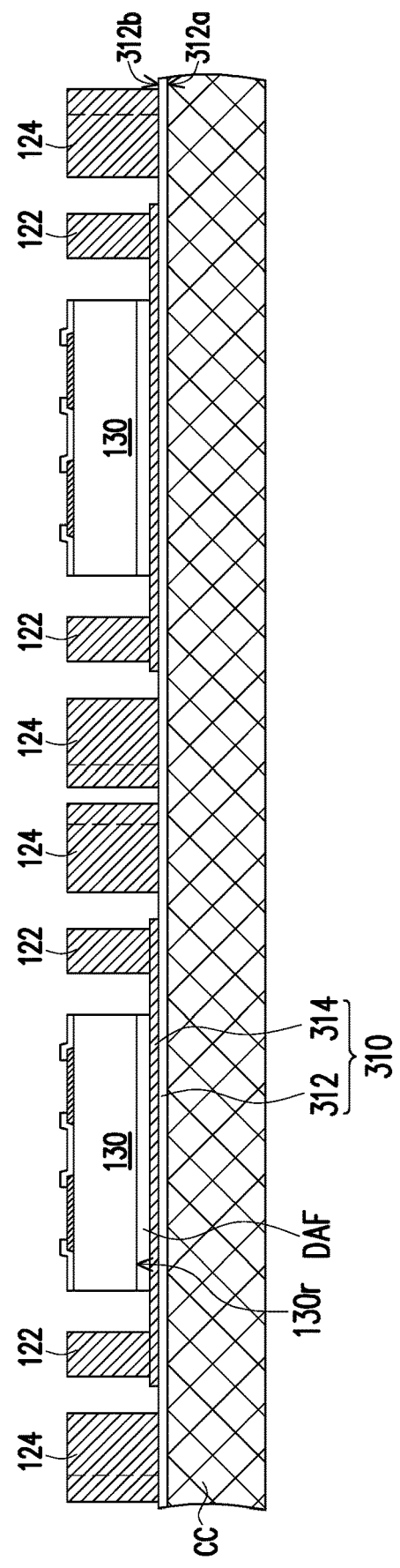
Figure 7C:
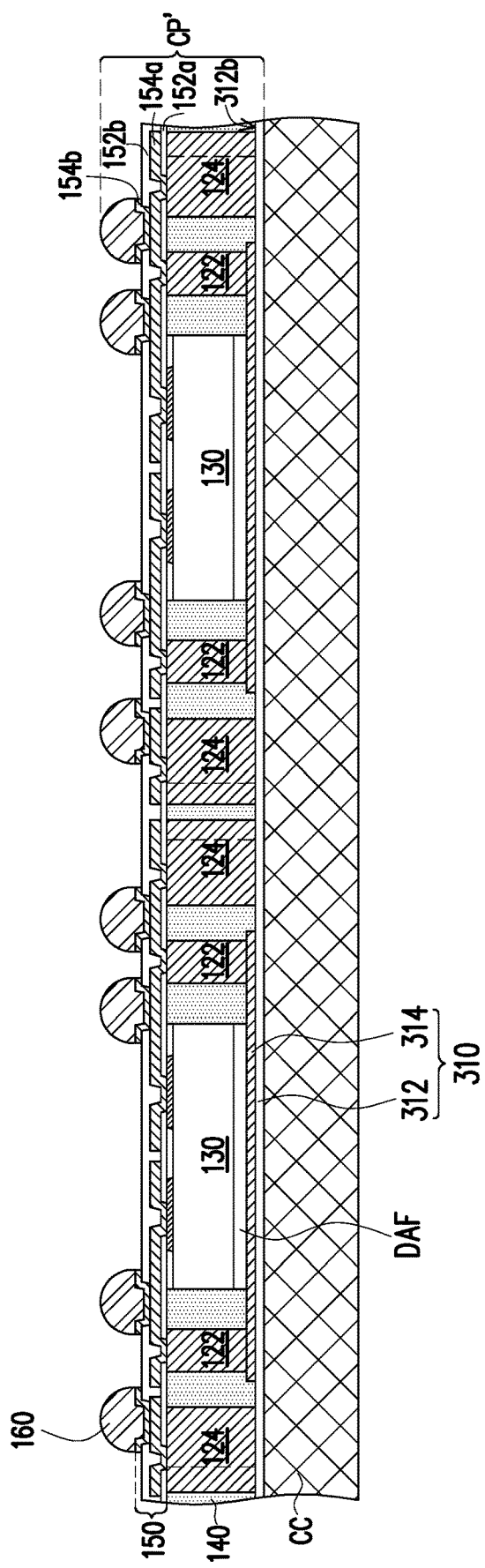
Figure 7D:
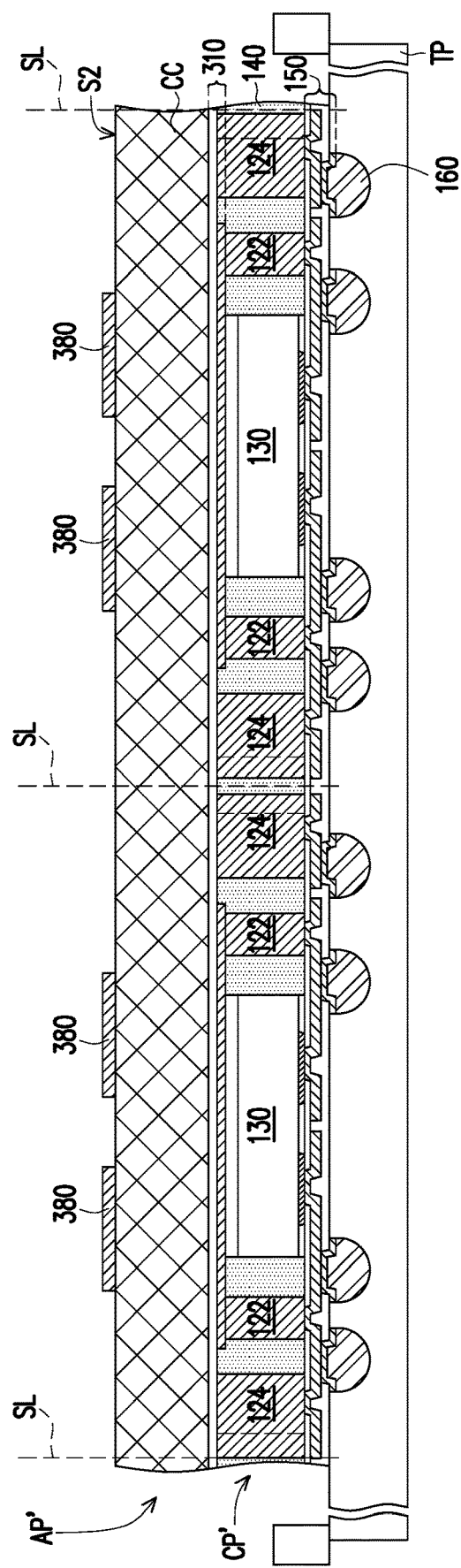
Figure 7E:
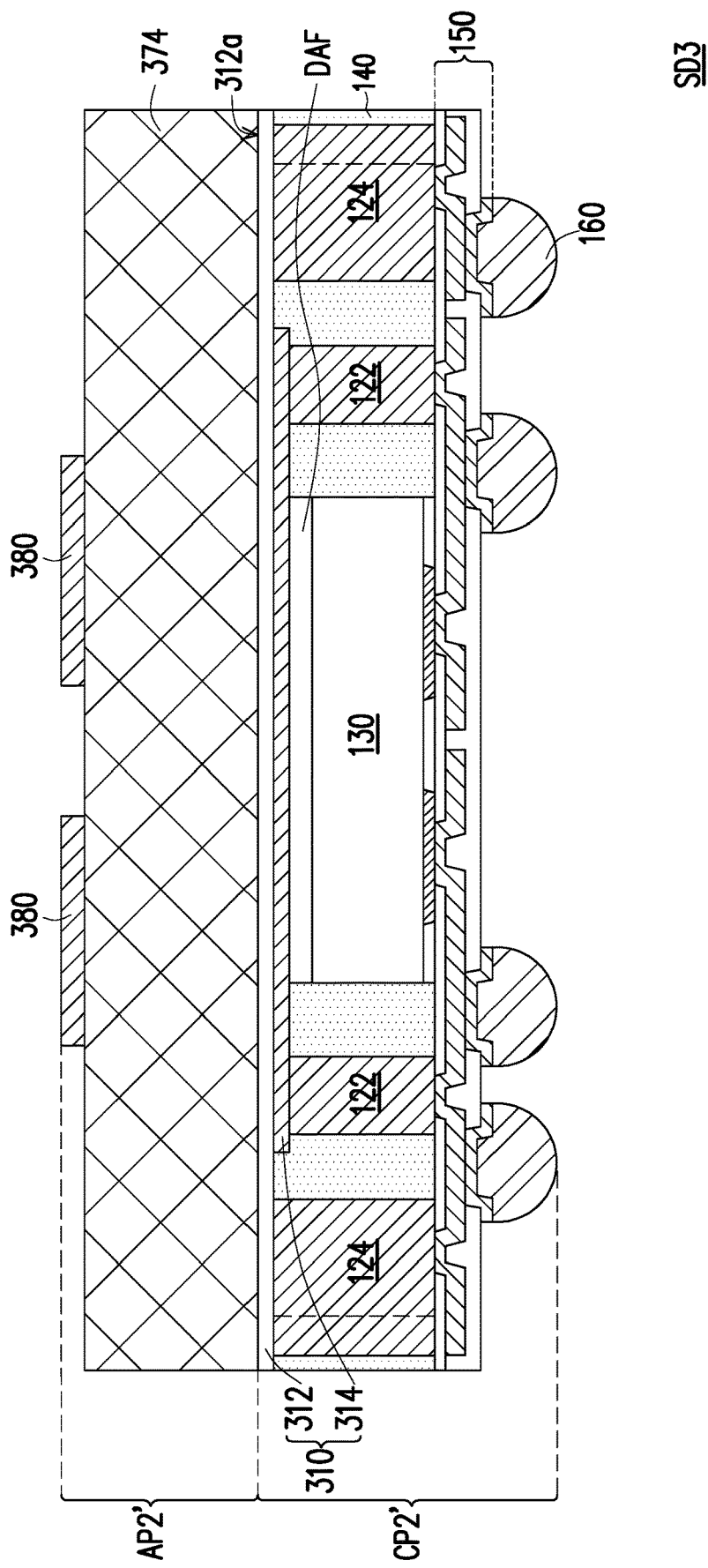
Figure 8:
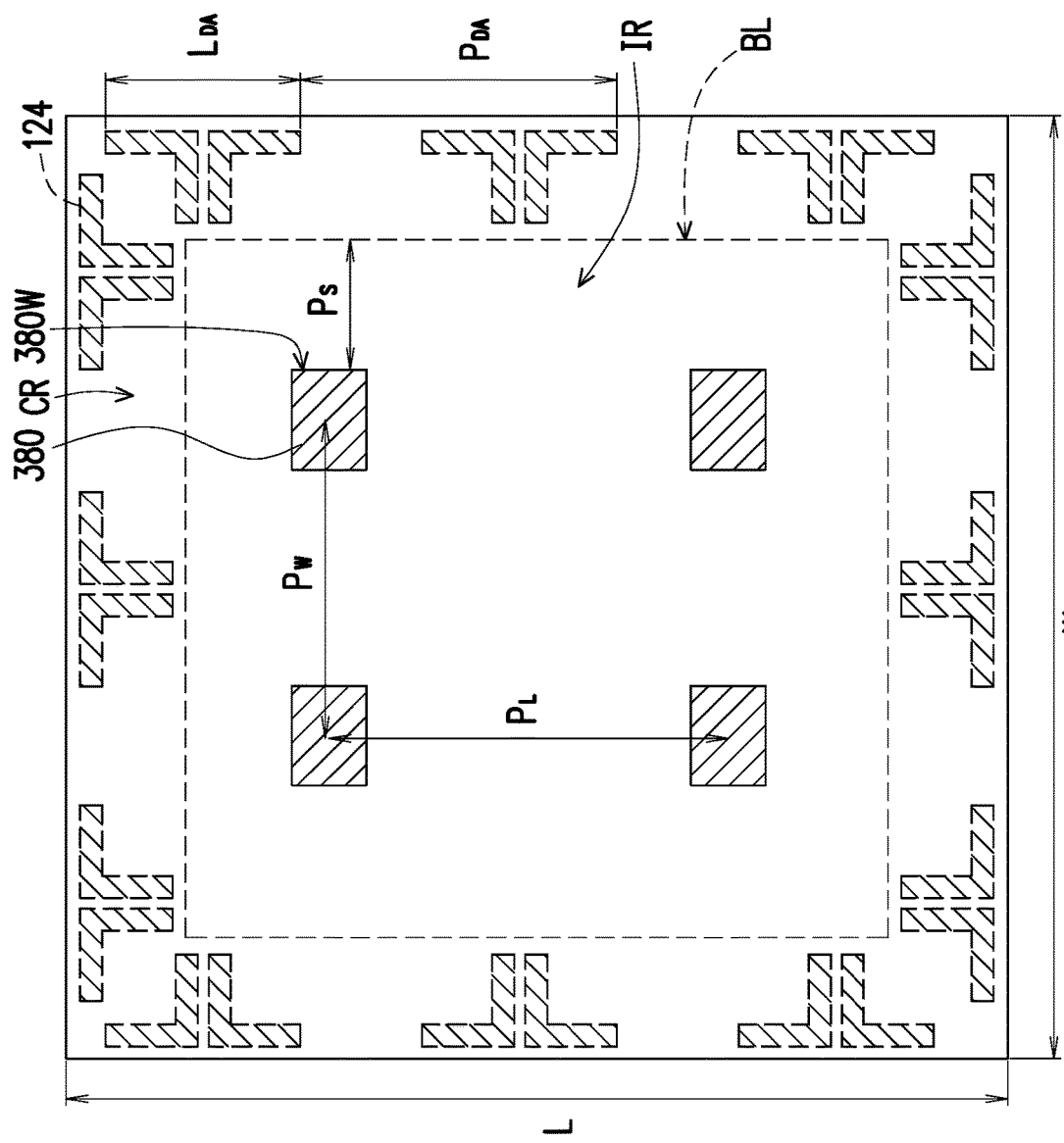
FIG. 8 is a schematic top view of antennas of a semiconductor device in accordance with some exemplary embodiments of the disclosure.

FIG. 7A to FIG. 7E are schematic cross-sectional views of various stages of manufacturing a semiconductor device in accordance with some exemplary embodiments of the disclosure, and FIG. 8 is a schematic top view of antennas of a semiconductor device in accordance with some exemplary embodiments of the disclosure. Referring to FIG. 7A, a ceramic carrier CC having a first surface S1 and a second surface S2 opposite to the first surface S1 is provided. In some embodiments, the ceramic carrier CC is provided in a wafer form. Alternatively, the ceramic carrier CC may be provided in any other suitable form (e.g., a panel form, a chip form, or a strip form, etc.) depending on the process requirements. In some embodiments, a material of the ceramic carrier CC is selected to have material properties of high thermal conductivity to provide better heat dissipation. In some embodiments, the selected material of the ceramic carrier CC has a permittivity (or dielectric constant (Dk)) higher than a conventional dielectric material (e.g., molding material having a Dk of about 3.3, or FR-4 having a Dk of about 4.5 to about 4.9). The selected material of the ceramic carrier CC may have a dissipation factor (or dielectric loss tangent, DO lower than the conventional dielectric material (e.g., FR-4 having a Df of about 0.013 to about 0.020). The lower the dissipation factor of the material of the ceramic carrier CC is, the less the signal transmission loss is. In some embodiments, the material of the ceramic carrier CC is selected to have a good processing property so as to withstand the semiconductor structure formed thereon. The material of the ceramic carrier CC may be chosen to have a coefficient of thermal expansion (CTE) closely matching the CTE of the semiconductor chip (e.g., silicon material) so as to prevent the subsequently formed chip package on the ceramic carrier CC from cracking or detaching under the influence of variations in temperature.

For example, a material of the ceramic carrier CC includes aluminum nitride (AlN), silicon carbide (SiC), aluminum oxide ($Al_2O_3$), silicon nitride ($Si_3N_4$), boron nitride (BN), zirconia ($ZrO_2$), or other suitable materials. In some embodiments in which an aluminum nitride wafer is used, the ceramic carrier CC includes a permittivity (or dielectric constant; Dk) value ranging between about 7.7 and about 9.9, a dielectric loss tangent (Df) may be in a range of about 0.003 at 10 GHz to about 0.00045 at 140 GHz. The ceramic carrier CC may be tailored to provide a desired material property such as enhanced thermal conductivity, thereby facilitating heat dissipation. In some embodiments, the thermal conductivity of the ceramic carrier CC may be in a range of about 60 W/m-K to about 120 W/m-K. In certain embodiments, the thermal conductivity of the ceramic carrier CC may be in a range of about 80 W/m-K to about 180 W/m-K or about 200 W/m-K. In other embodiments, a thermal conductivity of the ceramic carrier CC at room temperature ranges from about 20 W/m-K to about 150 W/m-K. Alternatively, a thermal conductivity of the ceramic carrier CC at room temperature ranges from about 3 W/m-K to about 150 W/m-K. It should be noted that the last-mentioned values only serve as an example. Other suitable carrier materials having good dielectric properties and heat dissipation properties may be used.

Continue to FIG. 7A, a first redistribution structure 310 is formed on the first surface S1 of the ceramic carrier CC. The first redistribution structure 310 may include a first dielectric layer 312 and a first patterned conductive layer 314. In an exemplary embodiment, the method of forming the first redistribution structure 310 includes at least the following steps. A dielectric material (e.g., polybenzoxazole (PBO), polyimide (PI), benzocyclobutene (BCB), a combination thereof) is formed over the ceramic carrier CC using spin-coating, deposition, or the like, so as to form the first dielectric layer 312. A bonding layer (not shown) is optionally provided on the ceramic carrier CC, and the first dielectric layer 312 may be formed on the bonding layer. The bonding layer may aid the adhesion between the ceramic carrier CC and the first dielectric layer 312. Subsequently, the first patterned conductive layer 314 is formed on the first dielectric layer 312 by depositing the seed layer (not shown) on the first dielectric layer 312, forming a photoresist layer with openings (not shown) on the seed layer, depositing the conductive material (e.g., copper, aluminum, gold, nickel, silver, palladium, tin, etc.) on the seed layer and inside the openings of the photoresist layer, removing the photoresist layer, and etching the unmasked portion of the seed layer, etc. Other suitable patterning and metallization processes may be employed to form the first patterned conductive layer 314. The first patterned conductive layer 314 is spatially apart from the ceramic carrier CC by the first dielectric layer 312. A first surface 312a of the first dielectric layer 312 may face toward the ceramic carrier CC, and a second surface 312b (e.g., opposite to the first surface 312a) of the first dielectric layer 312 may be in physical contact with the first patterned conductive layer 314. In some embodiments, additional patterned dielectric layer(s) exposing the underlying patterned conductive layer, and additional patterned conductive layer(s) connecting the underlying patterned conductive layer may be formed alternately to obtain a multi-layered first redistribution structure.

Referring to 7B, after forming the first redistribution structure 310, the first TIVs 122 and the second TIVs 124 are provided on the first redistribution structure 310 using, for example, plating, placing, or other suitable techniques. For example, the first TIVs 122 is formed on the first patterned conductive layer 314 so that the first TIVs 122 is in physical and electrical contact with the first patterned conductive layer 314. The second TIVs 124 may be formed on the second surface 312b of the first dielectric layer 312. In alternative embodiments, the second TIVs 124 are omitted. The forming processes of the first and second TIVs 122 and 124 may be similar to that of the first and second TIVs 122 and 124 described in FIG. 1B, and the detailed descriptions are omitted for brevity.

Still referring to FIG. 7B, one or more the semiconductor chip(s) 130 may be picked and placed on the first redistribution structure 310. In some embodiments, the semiconductor chip 130 is provided with a dielectric film DAF adhere to the rear surface 130r of the semiconductor chip 130. The semiconductor chip 130 may be bonded to the first redistribution structure 310 through the dielectric film DAF. In some embodiments, the rear surface 130r of the semiconductor chip 130 is attached to the first patterned conductive layer 314 via the dielectric film DAF. The semiconductor chip 130 may be similar to the semiconductor chip 130 described in FIG. 1C, so the details thereof are omitted for brevity. After forming the first and second TIVs 122 and 124 and disposing the semiconductor chip 130, the semiconductor chip 130 is surrounded by the first TIVs 122, and the first TIVs 122 are disposed between the second TIVs 124 and the semiconductor chip 130. The sequence of forming the first and second TIVs 122 and 124 and disposing semiconductor chip 130 may be adjusted, which construes no limitation in the disclosure.

Referring to 7C, the encapsulation 140, the second redistribution structure 150, and the conductive terminals 160 are sequentially formed. In an exemplary embodiment, the encapsulation 140 is initially formed on the second surface 312b of the first dielectric layer 312 to laterally enclose the first and second TIVs 122 and 124 and the semiconductor chip 130. Next, the second redistribution structure 150 including at least one second patterned dielectric layer (e.g., 152a, 152b) and at least one second patterned conductive layer (e.g., 154a, 154b) is formed on the encapsulation 140. Subsequently, the conductive terminals 160 are formed on the second redistribution structure 150 for further electrical connection. Thus, a chip package CP' is formed on the ceramic carrier CC. The bottommost one of the second patterned conductive layer 154a may be in physical and electrical contact with the first and second TIVs 122 and 124 and the conductive pads 134 of the semiconductor chip 130. The topmost one of the second patterned conductive layer 154b may be in physical and electrical contact with the conductive terminals 160. The forming processes of the encapsulation 140, the second redistribution structure 150, and the conductive terminals 160 may be similar to those of the encapsulation 140, the second redistribution structure 150, and the conductive terminals 160 described in FIG. 1D to FIG. 1F, and the details thereof are omitted for brevity.

Referring to 7D, after forming the conductive terminals 160, the chip package CP' may be overturned and placed on the tape TP to perform the following processes on the second surface S2 of the ceramic carrier CC. For example, an antenna pattern 380 is formed on the second surface S2 of the ceramic carrier CC using printing, plating, or other suitable deposition process. The antenna pattern 380 may be formed by a plurality of conductive blocks arranged in arrays as mentioned above. As compared to the antenna pattern formed on the conventional dielectric material (e.g., molding material, FR-4), the size of the antenna pattern 380 formed on the ceramic carrier CC with relatively high dielectric constant may be reduced as will be described in greater details later in accompany with FIG. 8. After forming the antenna pattern 380 on the ceramic carrier CC, the manufacture of an antenna package AP' is substantially completed. Subsequently, a singulation process may be performed along the singulation lines SL to cut through the ceramic carrier CC, the first redistribution structure 310, the encapsulation 140, and the second redistribution structure 150, thereby separate the structures overlying the tape TP from one another.

Referring to FIG. 7E and FIG. 8, after performing the singulation process, a semiconductor device SD3 is formed. The semiconductor device SD3 includes a singulated chip package CP2' and a singulated antenna package AP2' stacked on the singulated chip package CP2'. The singulated chip package CP2' includes the first redistribution structure 310, the first and second TIVs 122 and 124 disposed on the first redistribution structure 310, the semiconductor chip 130 electrically coupled to the first redistribution structure 310 and the first and second TIVs 122 and 124, the encapsulation 140 disposed on the first redistribution structure 310 and laterally encapsulating the semiconductor chip 130, the first and second TIVs 122 and 124, the second redistribution structure 150 disposed on the encapsulation 140 and electrically connected to the semiconductor chip 130, the first and second TIVs 122 and 124, and the conductive terminals 160 disposed on the second redistribution structure 150 and electrically coupled to the semiconductor chip 130 through the second redistribution structure 150. The singulated antenna package AP2' includes an intermediate structure 374 singulated from the ceramic carrier CC, and the antenna pattern 380 disposed on the intermediate structure 374. The intermediate structure 374 is attached onto the first surface 312a of the first dielectric layer 312 of the first redistribution structure 310. Since the intermediate structure 374 is formed by cutting the ceramic carrier CC, a temporary carrier for forming the chip package may be omitted from the manufacturing method of the semiconductor device SD3, thereby reducing the manufacturing cost.

Still referring to FIG. 8, it should be noted that FIG. 8 only shows an exemplary configuration of the antenna pattern 380 and the second TIVs 124, and other elements in the semiconductor device SD3 is omitted for ease of illustration. In addition, the second TIVs 124 are illustrated in the dashed lines to show that the second TIVs 124 and the antenna pattern 380 are located at different levels. In some embodiments, the antenna pattern 380 is a patch antenna pattern disposed in an inboard region IR, and the second TIVs 124 disposed in the outer circumferential region CR may form a dipole antenna pattern. As mentioned above, each of the dipole antennas formed by the second TIVs 124 includes two L-shaped dipole arms. Each of the dipole antennas may have a length of dipole antenna $L_{DA}$. A pitch of dipole antenna $P_{DA}$ may be defined by two adjacent dipole antennas. The length of dipole antenna $L_{DA}$ and the pitch of dipole antenna $P_{DA}$ may be determined depending on the product requirements and may not be changed accompanying with the materials of the encapsulation of the chip package and the overlaying intermediate structure. Multiple dipole antennas may be disposed on the outer circumferential region CR to encircle the antenna pattern 380 disposed on the inboard region IR. The shape of the outer circumferential region CR and the inboard region IR may vary depending on the antenna design. A pitch $P_S$ is defined by one of the sidewalls 380W of the antenna pattern 380 and the closest boundary line BL of the outer circumferential region CR and the inboard region IR. The antenna pattern 380 may be formed by the array of the conductive blocks, and two adjacent conductive blocks may have a pitch $P_W$ in a width direction and a pitch $P_L$ in a length direction. The pitches $P_S$, $P_L$ and $P_W$ may be determined depending on the product requirements and may not be changed accompanying with the material of the intermediate structure underneath.

The size of the antenna pattern 380 may be changed due to the material of the intermediate structure 374 underneath. The surface areas of the conductive blocks of the antenna pattern 380 may be affected by the dielectric constant (Dk) of the underlying intermediate structure 374. For example, the surface areas of the conductive blocks of the antenna pattern 380 may be directly proportional to the reciprocal of the square root of the dielectric constant of the intermediate structure 374. In some embodiments, the material of the intermediate structure 374 is selected to have a relatively high dielectric constant compared with the conventional dielectric material (e.g., molding material or FR-4), and thus the size of the antenna pattern 380 disposed on the intermediate structure 374 may be reduced. The length L and width W of the semiconductor device SD3 may be also reduced due to the shrinkage of the antenna size. For example, as compared to the device using the conventional dielectric material (e.g., molding compound) as the intermediate structure, the size (e.g., length L times width W) of the semiconductor device SD3 may be reduced about 12% or more of the size of the device using the conventional dielectric material. It should be appreciated that intermediate structure 374 is not necessary to have a high dielectric constant, since a low dielectric constant material may provide some merits in certain operational frequency bands. Depending on the application of the semiconductor device SD3, the material of the intermediate structure 374 may be adjusted for optimal antenna performance.

Figure 9A:
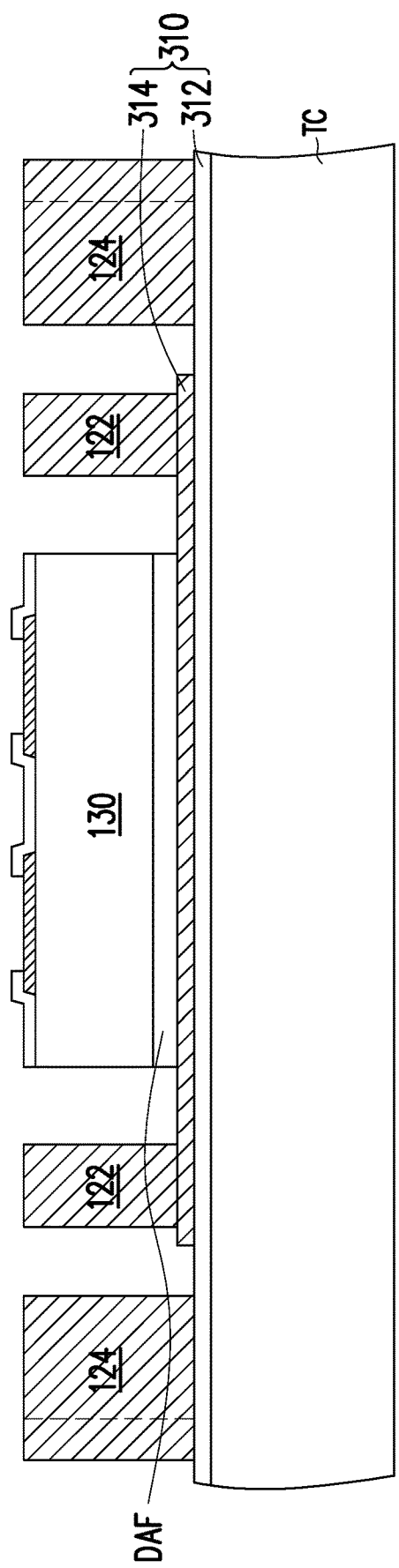
FIG. 9A to FIG. 9D are schematic cross-sectional views of various stages of manufacturing a semiconductor device in accordance with some exemplary embodiments of the disclosure.
Figure 9B:
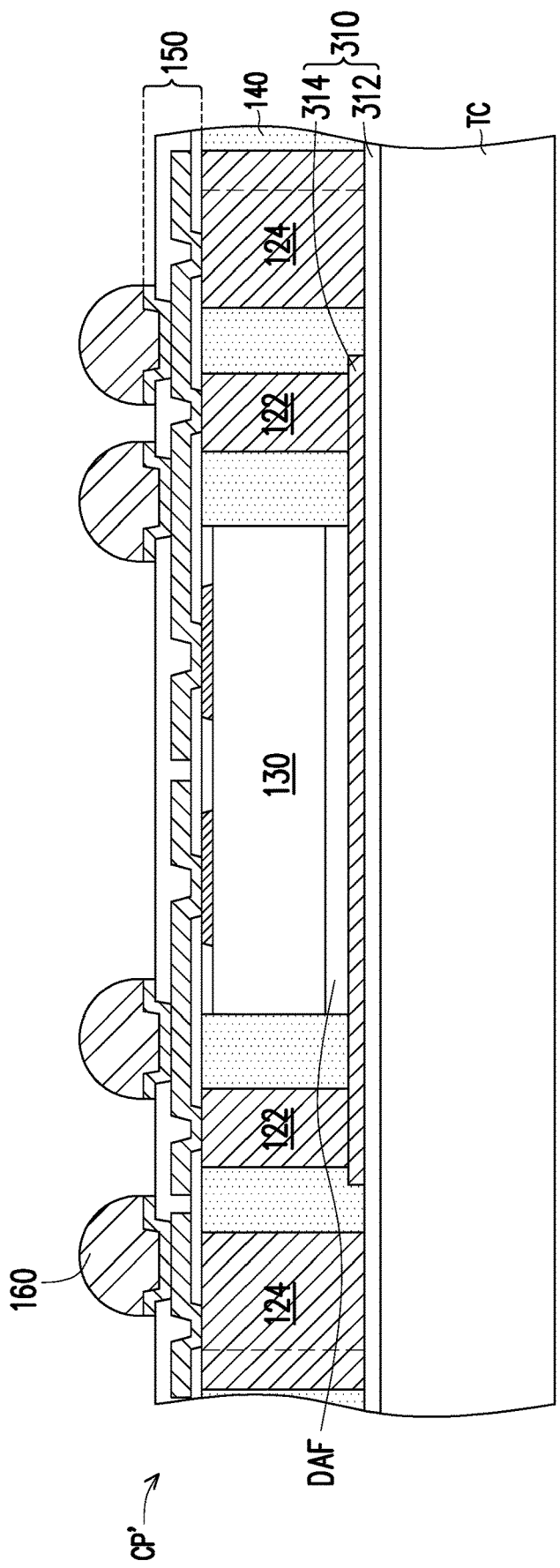

FIG. 9A to FIG. 9D are schematic cross-sectional views of various stages of manufacturing a semiconductor device in accordance with some exemplary embodiments of the disclosure. Referring to FIG. 9A and FIG. 9B, the chip package CP' is formed on the temporary carrier TC. For example, the first redistribution structure 310 including the first dielectric layer 312 and the first patterned conductive layer 314 is initially formed on the temporary carrier TC. Next, the first and second TIVs 122 and 124 is formed on the first redistribution structure 310, and the semiconductor chip 130 is disposed on the first redistribution structure 310 and surrounded by the first TIVs 122. The semiconductor chip 130 may be bonded to the first patterned conductive layer 314 through the die attach film DAF. The forming processes of the first redistribution structure 310 and the first and second TIVs 122 and 124, and the placing process of the semiconductor chip 130 may be similar to that of the first redistribution structure 310, the first and second TIVs 122 and 124, and the semiconductor chip 130 described in FIGS. 7A and 7B. The difference lies in that the ceramic carrier is replaced by the temporary carrier TC which may be removed after the formation of chip package. In some embodiments, a de-bonding layer (not shown) is provided on the temporary carrier TC before forming the first dielectric layer 312, and the first dielectric layer 312 is formed on the de-bonding layer. For example, the de-bonding layer is a light-to-heat conversion (LTHC) release layer which can aid the removal of the temporary carrier TC in the subsequent processes.

Subsequently, the encapsulation 140, the second redistribution structure 150, and the conductive terminals 160 are sequentially formed. The forming processes of the encapsulation 140, the second redistribution structure 150, and the conductive terminals 160 may be similar to that of the encapsulation 140, the second redistribution structure 150, and the conductive terminals 160 described in FIG. 7C, and the details thereof are omitted for brevity. After forming the conductive terminals 160, the chip package CP' may be overturned and placed on the tape TP, and then the temporary carrier TC may be removed from the first dielectric layer 312 by, for example, irradiating the de-bonding layer (e.g., the LTHC release layer disposed on the temporary carrier TC; not shown) with UV light or laser beam. Thus, the first surface 312a of the first dielectric layer 312 is exposed for further processing.

Figure 9C:
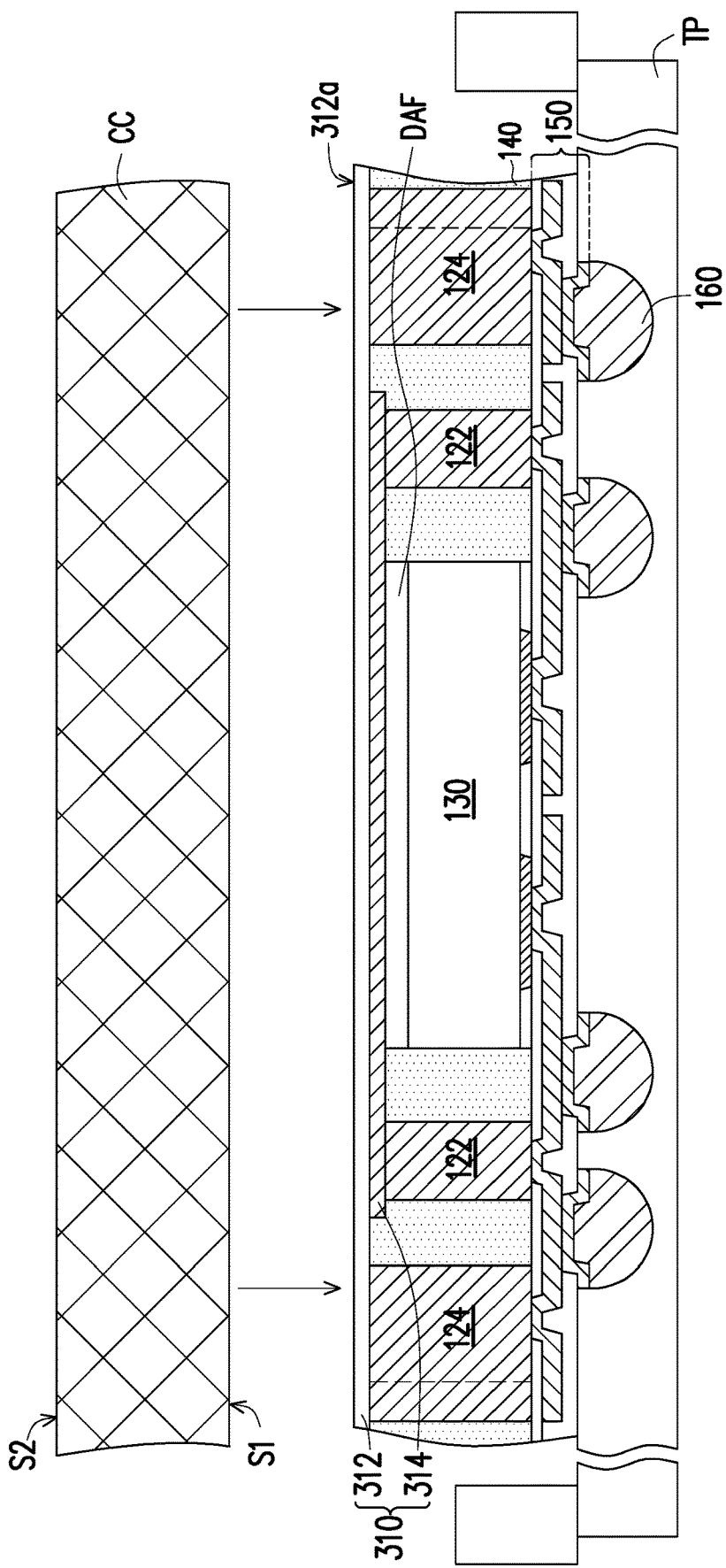
Figure 9D:
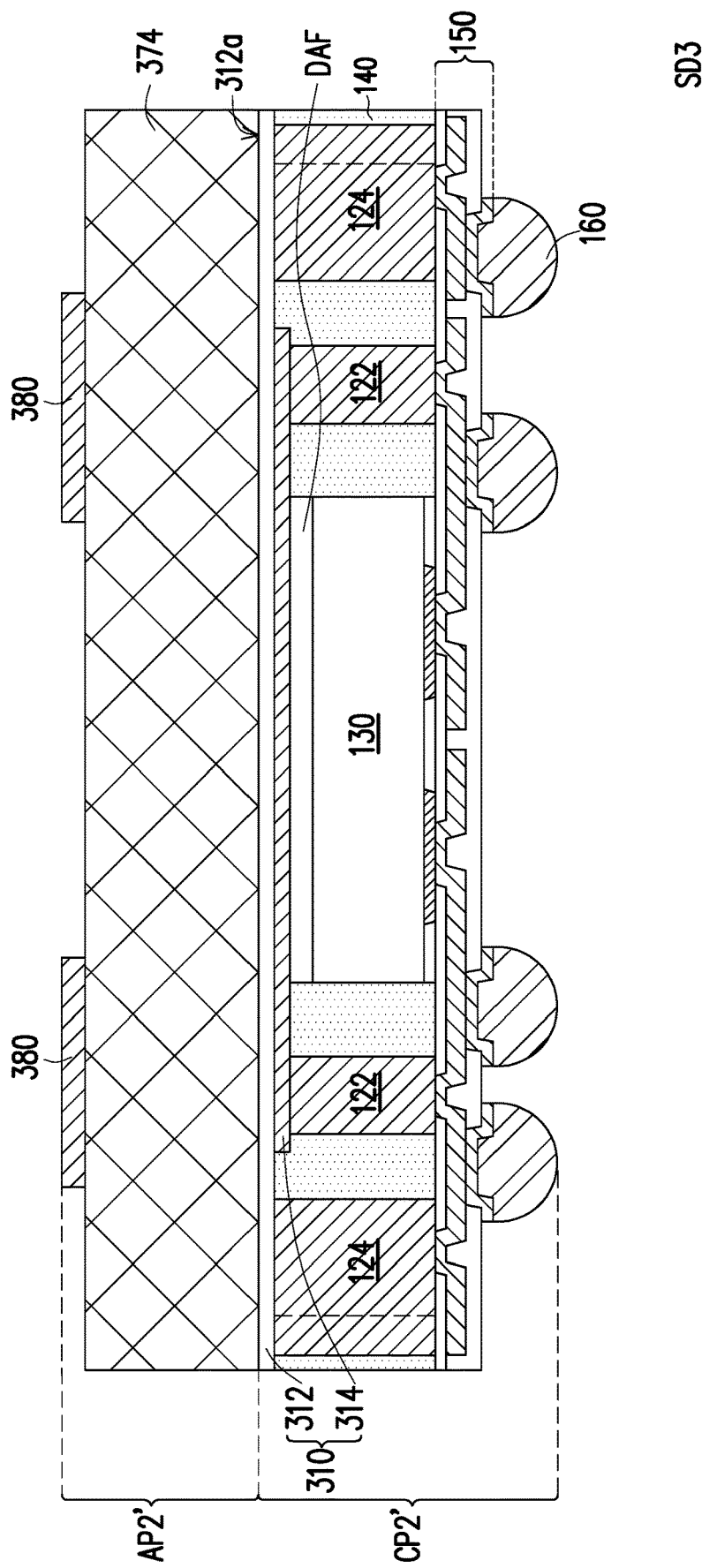

Referring to FIG. 9C and FIG. 9D, the antenna package including the ceramic carrier CC and the antenna pattern 380 is formed on the chip package CP'. For example, the ceramic carrier CC is initially disposed on the chip package CP'. In some embodiments, a bonding layer (not shown) is formed on the first surface 312a of the first dielectric layer 312, so that the ceramic carrier CC and the chip package CP' are bonded to each other. Alternatively, the first surface S1 of the ceramic carrier CC is provided with the bonding layer. Next, the antenna pattern 380 may be formed on the second surface S2 of the ceramic carrier CC. Subsequently, a singulation process may be performed along the singulation lines to cut through the ceramic carrier CC, the first redistribution structure 310, the encapsulation 140, and the second redistribution structure 150, thereby separate the structures overlying the tape TP from one another. Thus, the semiconductor device SD3 including the singulated chip package CP2' and the singulated antenna package AP2' is formed, and the intermediate structure 374 singulated from the ceramic carrier CC is interposed between the antenna pattern 380 and the singulated chip package CP2'.

Figure 10:
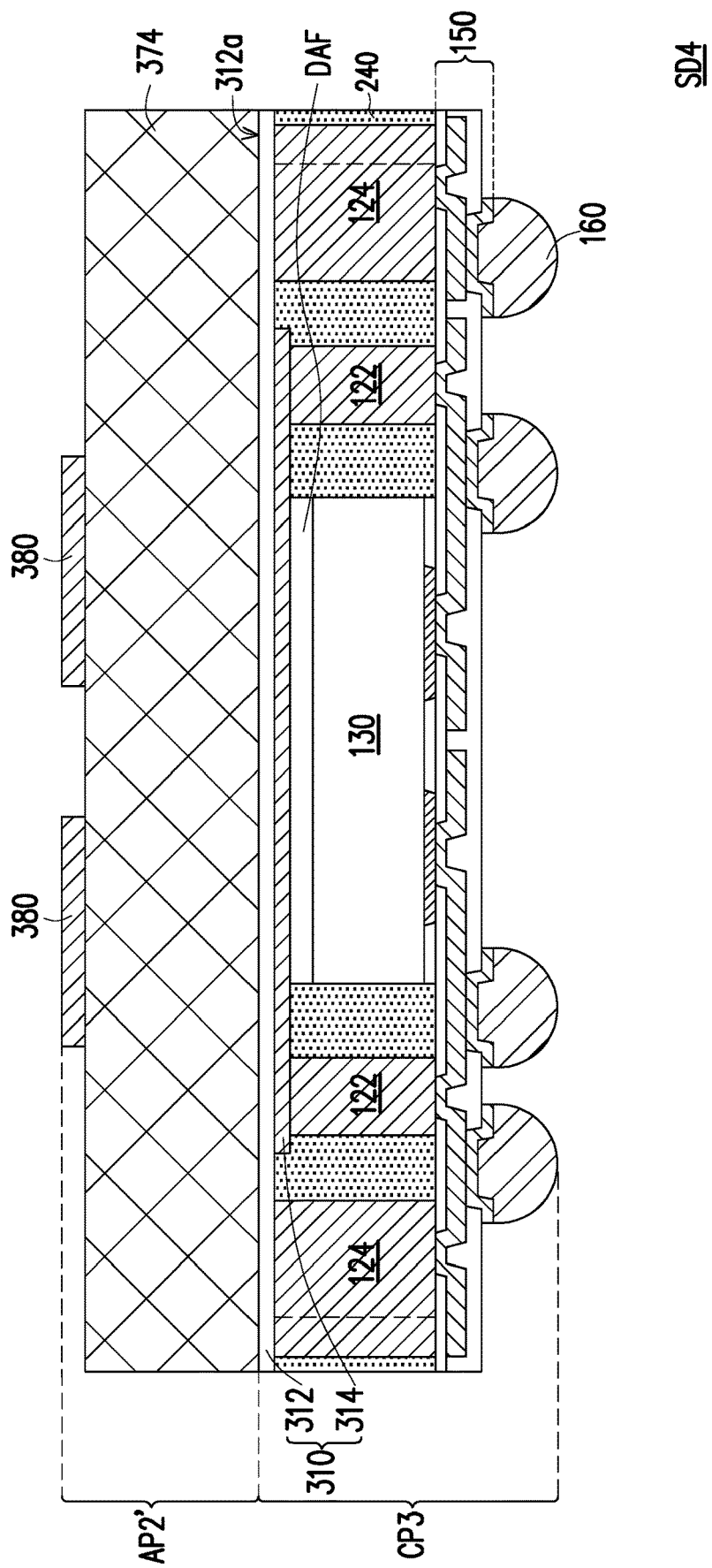
FIG. 10 is a schematic cross-sectional view of a semiconductor device in accordance with some exemplary embodiments of the disclosure.

FIG. 10 is a schematic cross-sectional view of a semiconductor device in accordance with some exemplary embodiments of the disclosure. Referring to FIG. 10, a semiconductor device SD4 including the singulated antenna package AP2' and a singulated chip package CP3 is provided. The singulated chip package CP3 is similar to the singulated chip package CP2' described in FIG. 9D, except for the encapsulation 240. The encapsulation 240 includes the base material, and the heat-conductive fillers distributed in the base material and arranged as a heat dissipation path. The material and the forming process of the encapsulation 240 may be similar to those of the encapsulation 240 described in FIG. 5 and FIG. 6, so the detailed descriptions are omitted for brevity. In other embodiments, the intermediate structure of the singulated antenna package may be replaced by the intermediate structure 274 described in FIG. 5. That is, the intermediate structure 274 including the base material and the heat-conductive fillers may be interposed between the antenna pattern 380 and the first redistribution structure 310. By disposing the intermediate structure 374 made of ceramic materials with high thermal conductivities (e.g., aluminum nitride) on the singulated chip package CP3 and forming the encapsulation 240 surrounding the semiconductor chip 130, the improvement of heat dissipation efficiency of the semiconductor device SD4 may be realized. For example, as compared to the conventional device having the antenna pattern formed on the conventional dielectric material and the molding material as the encapsulation, the thermal resistance of the semiconductor device SD4 may be reduced up to about 23% of the thermal resistance of the conventional device.

Figure 11:
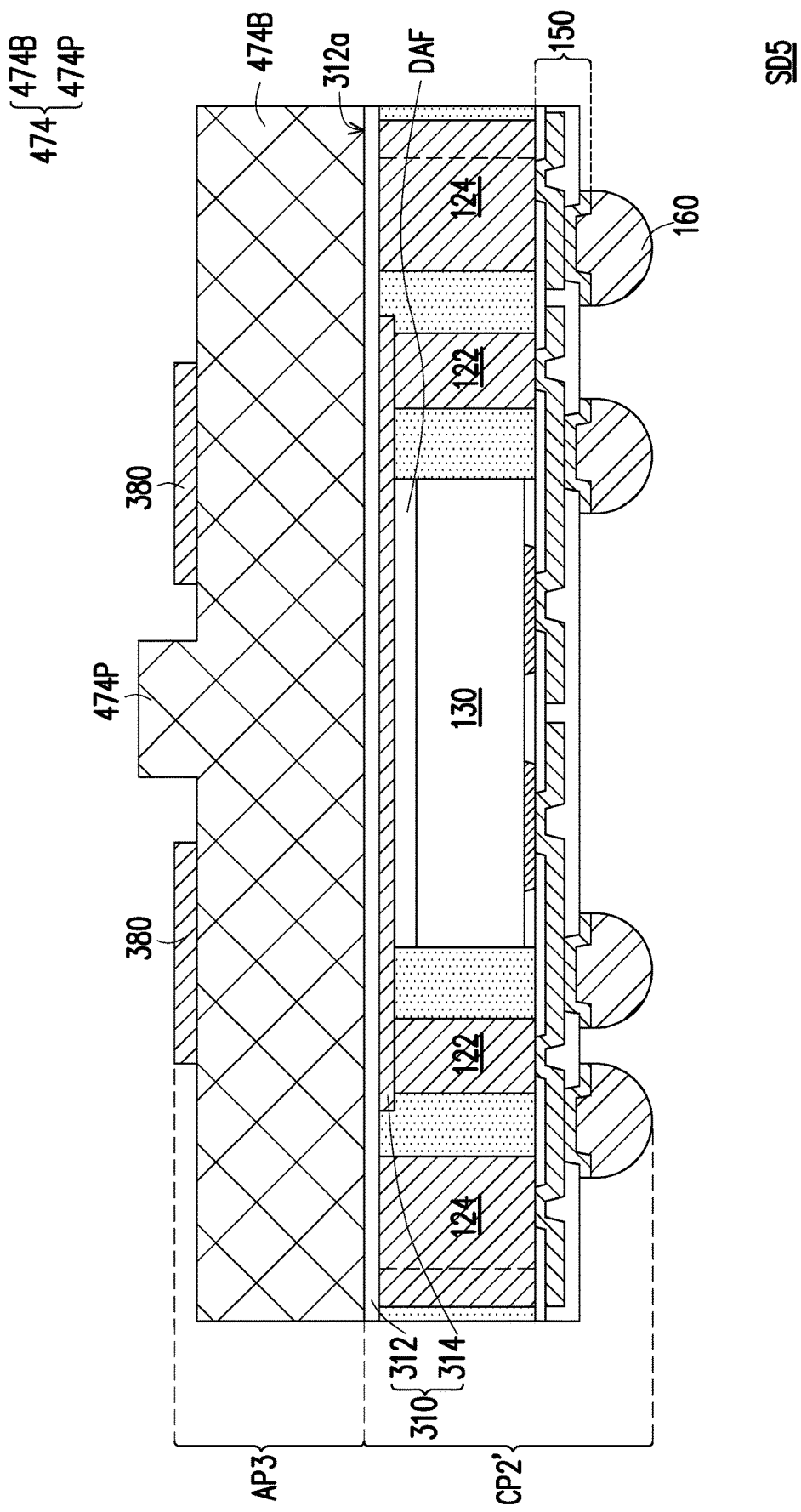
FIG. 11 is a schematic cross-sectional view of a semiconductor device in accordance with some exemplary embodiments of the disclosure.

FIG. 11 is a schematic cross-sectional view of a semiconductor device in accordance with some exemplary embodiments of the disclosure. Referring to FIG. 11, a semiconductor device SD5 including a singulated antenna package AP3 and the singulated chip package CP2' is provided. It should be noted that the singulated chip package CP2' may be replaced by the singulated chip package CP3 shown in FIG. 10 or the singulated chip package CP1 shown in FIG. 1K to form a semiconductor device in accordance with the product requirements. The singulated antenna package AP3 disposed on the singulated chip package CP2' includes an intermediate structure 474 and the antenna pattern 380 formed thereon. In some embodiments, the intermediate structure 474 includes a base 474B attached to the singulated chip package CP2', and a protrusion 474P disposed on the base 474B. In some embodiments, the protrusion 474P is disposed among the conductive blocks of the antenna pattern 380 so that the protrusion 474P is surrounded by the conductive blocks. It should be noted that FIG. 11 merely serves as an illustrative example. One or more protrusions may be disposed on the base 474B. Other configuration of the protrusion(s) 474P is possible. For example, the protrusion 474P is disposed at the corner(s) of the base 474B or may be disposed to encircle the antenna pattern 380. The configuration of the protrusion 474P may be adjusted depending on the product requirements.

In some embodiments, the base 474B and the protrusion 474P are made of a ceramic material with a high thermal conductivity (e.g., aluminum nitride). Alternatively, the material of the intermediate structure 474 is similar to that of the dielectric casing 172 described in FIG. 1K. In some embodiments, the base 474B and the protrusion 474P are made of the same material and may be integrally formed. Alternatively, the base 474B is initially disposed on the first dielectric layer 312 of the first redistribution structure 310, and then the protrusion 474P is formed on the base 474B at the predetermined region(s). The antenna pattern 380 may be formed prior to the formation of the protrusion 474P or may be formed after forming the protrusion 474P. The forming sequence of the intermediate structure 474 and the antenna pattern 380 may be adjusted depending on the process requirements. The protrusion 474P may be thicker than the conductive blocks of the antenna pattern 380 so that the protrusion 474P of the intermediate structure 474 is located at the outermost side of the singulated antenna package AP3 for further thermal connection. Alternatively, the protrusion 474P may be at the same height as the conductive blocks of the antenna pattern 380 or may be thinner than the conductive blocks of the antenna pattern 380.

Figure 12:
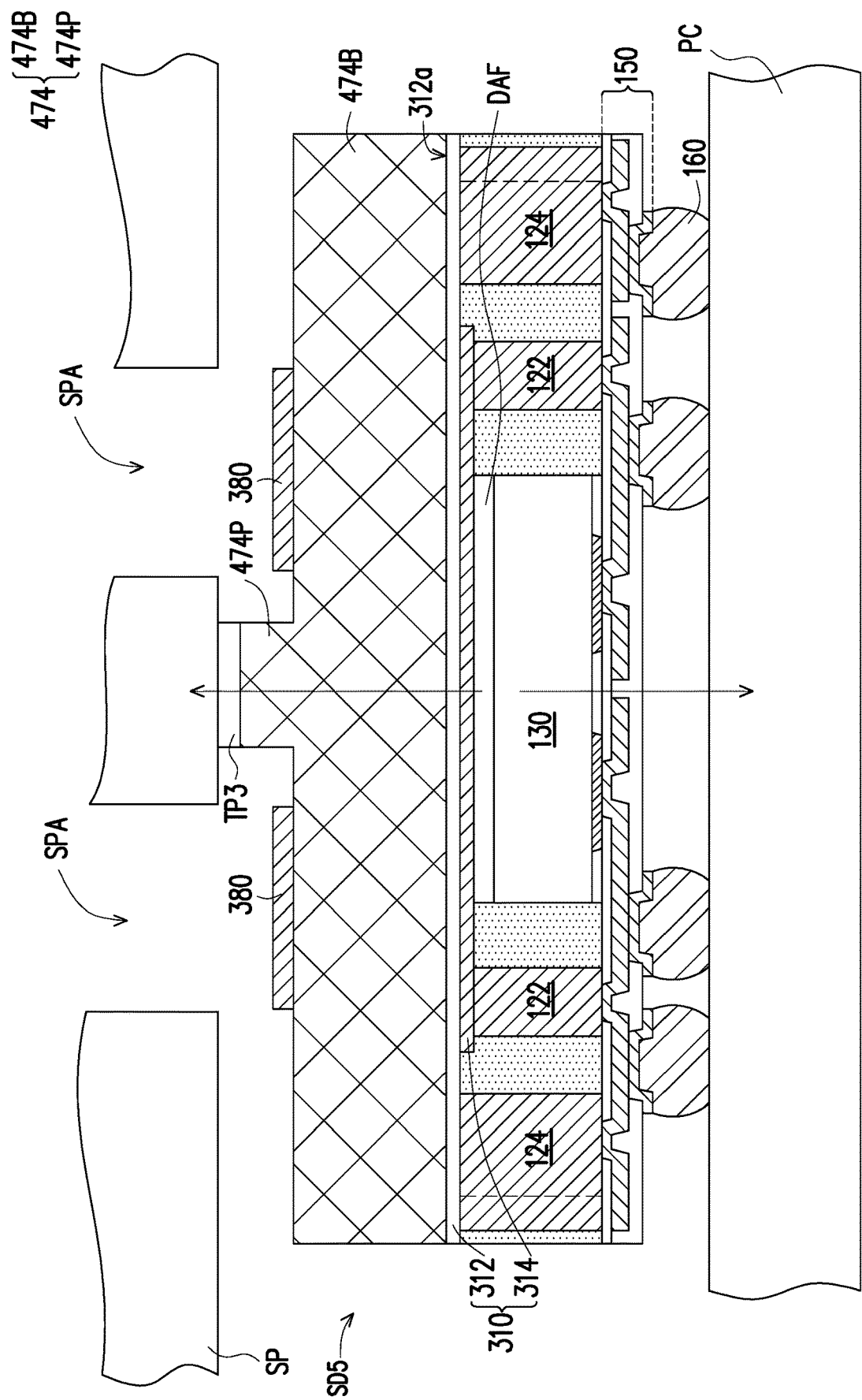
FIG. 12 is a schematic cross-sectional view of an application of a semiconductor device in accordance with some exemplary embodiments of the disclosure.

FIG. 12 is a schematic cross-sectional view of an application of a semiconductor device in accordance with some exemplary embodiments of the disclosure. Referring to FIG. 12, the semiconductor device SD5 may be mounted onto the package component PC through the conductive terminals 160. For example, the conductive terminals 160 of the semiconductor device SD5 are reflowed in order to be bonded on the package component PC. In some embodiments, the semiconductor device SD5 is thermally coupled to the plate SP. The plate SP may lean against the protrusion 474P of the intermediate structure 474. The plate SP may have a size larger than the semiconductor device SD5 to increase the heat dissipation efficiency. In some embodiments, the plate SP is bonded to the protrusion 474P through the third thermal conductive adhesive TA3. The plate SP with the apertures SPA may be aligned to the semiconductor device SD5 so as to let the apertures SPA expose the antenna pattern 380. The package component PC, the plate SP, and the third thermal conductive adhesive TA3 may be similar to the package component PC, the plate SP, and the third thermal conductive adhesive TA3 described in FIG. 4, and the details thereof are omitted for brevity. In certain embodiments in which the package component PC is disposed on the singulated chip package side of the semiconductor device SD5 and the plate SP is disposed on the singulated antenna package side of the semiconductor device SD5, during operation, the heat generated from the semiconductor chip 130 may be conducted to the package component PC as the arrow pointing downwardly in FIG. 12, and also the heat may be conducted to the plate SP as the arrow pointing upwardly in FIG. 12. Thus, with multiple heat dissipation paths, the heat dissipation efficiency of the semiconductor device SD5 may be improved.

According to some embodiments, the semiconductor device including a chip package and an antenna package disposed on the chip package is provided. The chip package includes a semiconductor chip, an encapsulation enclosing the semiconductor chip, and a redistribution structure disposed on the semiconductor chip and the encapsulation and electrically coupled to the semiconductor chip. The antenna package includes an antenna pattern electrically coupled to the chip package, and an intermediate structure disposed between the antenna pattern and the chip package, wherein the intermediate structure comprises a ceramic element in contact with the redistribution structure and thermally dissipating a heat generated from the semiconductor chip.

According to some embodiments, a manufacturing method of a semiconductor device includes at least the following steps. A dielectric casing is formed on a chip package, wherein the chip package includes a redistribution circuit layer, a semiconductor chip electrically coupled to the redistribution circuit layer, and an encapsulation disposed over the redistribution circuit layer and encapsulating the semiconductor chip, and a cavity of the dielectric casing exposes at least a portion of the redistribution circuit layer. An antenna pattern is provided on the dielectric casing to surround the cavity of the dielectric casing. A ceramic protrusion is disposed inside the cavity of the dielectric casing to form an antenna package, wherein a heat generated from the semiconductor chip of the chip package is dissipated through the redistribution circuit layer and the ceramic protrusion.

According to some embodiments, a manufacturing method of a semiconductor device includes at least the following steps. A redistribution structure is formed on a first surface of an intermediate structure, wherein the intermediate structure is made of a ceramic material. A semiconductor chip is encapsulated with an encapsulation on the redistribution structure to form a chip package on the intermediate structure. An antenna pattern is provided on a second surface of the intermediate structure opposite to the chip package.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
a chip package, comprising:
   a semiconductor chip;
   an encapsulation enclosing the semiconductor chip; and
   a redistribution structure disposed on the semiconductor chip and the encapsulation and electrically coupled to the semiconductor chip; and
an antenna package disposed on the chip package, comprising:
   an antenna pattern electrically coupled to the chip package; and
   an intermediate structure disposed between the antenna pattern and the chip package, wherein the intermediate structure comprises a dielectric casing disposed on the chip package and a ceramic protrusion accommodated in the dielectric casing and corresponding to the semiconductor chip, the ceramic protrusion is in contact with the redistribution structure and thermally dissipates a heat generated from the semiconductor chip, and the ceramic protrusion is surrounded by the antenna pattern and protruded from the dielectric casing.

2. The semiconductor device of claim 1, wherein the antenna pattern comprises a conductive block, and a corner of the conductive block faces a sidewall of the ceramic protrusion in a plan view.

3. The semiconductor device of claim 1, wherein the antenna pattern comprises a plurality of conductive blocks, and a shortest distance between a central axis of the semiconductor chip and each of the conductive blocks of the antenna pattern is substantially equal in a plan view.

4. The semiconductor device of claim 1, wherein the intermediate structure further comprises an underfill disposed on the redistribution structure and within the cavity of the dielectric casing to cover at least a bottom of the ceramic protrusion.

5. The semiconductor device of claim 1, wherein the intermediate structure further comprises:
   a thermal conductive adhesive disposed between the ceramic protrusion and the portion of the redistribution structure of the chip package.

6. The semiconductor device of claim 1, wherein a trench of the intermediate structure is located between a sidewall of the dielectric casing and a sidewall of the ceramic protrusion.

7. The semiconductor device of claim 1, wherein the encapsulation of the chip package comprises a plurality of heat-conductive fillers dissipating the heat generated from the semiconductor chip.

8. The semiconductor device of claim 1, wherein the ceramic protrusion of the intermediate structure is a plurality of ceramic fillers dissipating the heat generated from the semiconductor chip.

9. The semiconductor device of claim 1, wherein a patterned conductive layer of the redistribution structure is disposed at an outermost side of the chip package facing toward the antenna package.

10. A semiconductor device, comprising:
a semiconductor chip;
an encapsulation extending along sidewalls of the semiconductor chip;
a first redistribution structure disposed on the encapsulation and a back surface of the semiconductor chip, the first redistribution structure electrically coupled to the semiconductor chip;
a dielectric casing disposed on the first redistribution structure opposite to the encapsulation, the dielectric casing comprising a through hole corresponding to the semiconductor chip;
a ceramic protrusion disposed within the through hole of the dielectric casing and being in thermal contact with the first redistribution structure; and
an antenna pattern overlying the dielectric casing opposite to the first redistribution structure and electrically coupled to the semiconductor chip, wherein the ceramic protrusion is protruded higher than the antenna pattern relative to the first redistribution structure.

11. The semiconductor device of claim 10, wherein the dielectric casing is spatially apart from the ceramic protrusion by a trench encircling the ceramic protrusion.

12. The semiconductor device of claim 10, further comprising:
   a first thermal paste interposed between the back surface of the semiconductor chip and the first redistribution structure; and
   a second thermal paste interposed between the ceramic protrusion and the first distribution structure.

13. The semiconductor device of claim 10, further comprising:
   a second redistribution structure disposed on an active surface of the semiconductor chip and the encapsulation that are opposite to the first redistribution structure; and
   a through insulating via disposed aside the semiconductor chip and penetrating through the encapsulation to be connected to the first redistribution structure and the second redistribution structure.

14. The semiconductor device of claim 10, further comprising:
   a thermal paste interposed between the back surface of the semiconductor chip and the first redistribution structure; and
   an underfill disposed on the first redistribution structure within the through hole of the dielectric casing and surrounding a bottom of the ceramic protrusion.

15. A semiconductor device, comprising:
a redistribution structure comprising a first surface and a second surface opposite to each other;
a semiconductor chip laterally encapsulated by an encapsulation and disposed on the second surface of the redistribution structure;
a dielectric layer overlying the first surface of the redistribution structure;
a thermal-dissipating protrusion disposed over the first surface of the redistribution structure, the thermal-dissipating protrusion located within a hollow region of the dielectric layer and extending higher than a top surface the dielectric layer; and
an antenna pattern overlying the top surface of the dielectric layer, arranged aside the thermal-dissipating protrusion, and electrically coupled to the semiconductor chip.

16. The semiconductor device of claim 15, wherein the thermal-dissipating protrusion comprises a ceramic material dissipating a heat generated from the semiconductor chip.

17. The semiconductor device of claim 15, wherein the thermal-dissipating protrusion is protruded higher the antenna pattern relative to the redistribution structure.

18. The semiconductor device of claim 15, further comprising:
- a first thermal paste disposed between the semiconductor chip and the second surface of the first redistribution structure; and
- a second thermal paste disposed between the thermal-dissipating protrusion and the first surface of the first redistribution structure.

19. The semiconductor device of claim 15, wherein the thermal-dissipating protrusion in the hollow region of the dielectric layer is spatially separated from inner sidewalls of the dielectric layer by a trench encircling the thermal-dissipating protrusion.

20. The semiconductor device of claim 15, wherein a central axis of the semiconductor chip is substantially aligned with a central axis of the thermal-dissipating protrusion.

* * * * *